(12) United States Patent
Song et al.

(10) Patent No.: US 10,488,716 B2
(45) Date of Patent: Nov. 26, 2019

(54) DISPLAY DEVICE

(71) Applicant: SAMSUNG DISPLAY CO., LTD., Yongin-si, Gyeonggi-do (KR)

(72) Inventors: Hyung Jin Song, Seongnam-si (KR); Kyung Ho Kim, Seongnam-si (KR); Kee Bum Park, Cheonan-si (KR); Dong Hee Shin, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 128 days.

(21) Appl. No.: 15/213,607

(22) Filed: Jul. 19, 2016

(65) Prior Publication Data

US 2017/0192317 A1 Jul. 6, 2017

(30) Foreign Application Priority Data

Jan. 6, 2016 (KR) .......................... 10-2016-0001642

(51) Int. Cl.
*H01L 27/32* (2006.01)
*G02F 1/1335* (2006.01)
(Continued)

(52) U.S. Cl.
CPC ...... *G02F 1/134336* (2013.01); *G02F 1/1337* (2013.01); *G02F 1/1368* (2013.01); *G02F 1/13306* (2013.01); *G02F 1/13439* (2013.01); *G02F 1/13624* (2013.01); *G02F 1/133512* (2013.01); *G02F 1/133514* (2013.01); *H01L 27/124* (2013.01); *H01L 27/1218* (2013.01); *H01L 29/78633* (2013.01); *G02F 1/136227* (2013.01); *G02F 1/136286* (2013.01); *G02F 2001/133519* (2013.01); *G02F 2001/133742* (2013.01); *G02F 2001/134345* (2013.01); (Continued)

(58) Field of Classification Search
CPC ........... H01L 27/3272; G02F 1/133512; G02F 1/136227; G02F 2001/134345; G02F 1/136209; G02F 2001/133565; G02F 1/136213; G02F 2001/134354; G02F 1/163209; G09G 2300/0452; G09G 2300/0443
See application file for complete search history.

(56) References Cited

U.S. PATENT DOCUMENTS

| | | | |
|---|---|---|---|
| 9,389,470 B1* | 7/2016 | Tien | ................... G02F 1/136209 |
| 2002/0126239 A1* | 9/2002 | Anno | ................. G02F 1/136209 349/110 |

(Continued)

*Primary Examiner* — Monica D Harrison
*Assistant Examiner* — John Lin
(74) *Attorney, Agent, or Firm* — Kile Park Reed & Houtteman PLLC

(57) ABSTRACT

A liquid crystal display device includes a gate line in a first direction, a data line in a second direction intersecting the first direction, a pixel including a first region having a transistor connected to the gate and data lines, and a contact hole connecting the transistor to a pixel electrode, and a second region having the pixel electrode, wherein a length of a first width along the first direction on the first region is longer than a length of a second width along the second direction on the first region, and wherein a length of a third width along the first direction on the second region is longer than a length of a fourth width along the second direction on the second region.

19 Claims, 18 Drawing Sheets

(51) Int. Cl.

| | |
|---|---|
| *G02F 1/1343* | (2006.01) |
| *G02F 1/133* | (2006.01) |
| *G02F 1/1337* | (2006.01) |
| *G02F 1/1362* | (2006.01) |
| *G02F 1/1368* | (2006.01) |
| *H01L 27/12* | (2006.01) |
| *H01L 29/786* | (2006.01) |

(52) U.S. Cl.
CPC .. *G02F 2201/121* (2013.01); *G02F 2201/123* (2013.01); *G02F 2203/01* (2013.01)

(56) References Cited

U.S. PATENT DOCUMENTS

| | | | |
|---|---|---|---|
| 2007/0146242 A1* | 6/2007 | Miller | G09G 3/2074 345/76 |
| 2009/0122223 A1* | 5/2009 | Hayano | G02F 1/133305 349/58 |
| 2012/0007843 A1* | 1/2012 | Hoshino | G02F 1/134336 345/204 |
| 2013/0285891 A1 | 10/2013 | Zhang | |
| 2013/0329155 A1* | 12/2013 | Kwak | G02F 1/136 349/43 |
| 2015/0362796 A1* | 12/2015 | Kong | G02F 1/136286 349/106 |

* cited by examiner

DISPLAY DEVICE

CROSS-REFERENCE TO RELATED APPLICATION

Korean Patent Application No. 10-2016-0001642, filed on Jan. 6, 2016, in the Korean Intellectual Property Office, and entitled: "Display Device," is incorporated by reference herein in its entirety.

BACKGROUND

1. Field

The present disclosure relates to a display device.

2. Description of the Related Art

Recently, flat panel display devices, e.g., a liquid crystal display (LCD) device and an organic light emitting diode (OLED) display device, are being actively developed. The LCD device obtains a desired image by applying an electric field to a liquid crystal layer contained between two display panels, and by controlling the intensity of the electric field to adjust transmittance of light passing through the liquid crystal layer. The OLED display device displays characters or images using electroluminescence of a specific organic material or polymers.

The flat panel display device may have a curved surface to provide an image with improved three-dimensional feeling and immersion feeling by providing a display region of the curved surface. The display device may be formed with a light shielding member that covers regions other that those displaying images.

SUMMARY

An aspect of the present disclosure provides a display device with increased transmittance.

According to an exemplary embodiment of the disclosure, there is provided a liquid crystal display device. The liquid crystal display device comprising, a gate line extending in a first direction, a data line extending in a second direction intersecting with the first direction, a pixel comprising a first region in which a transistor connected to the gate line and the data line and a contact hole for connecting the transistor and a pixel electrode are disposed, and a second region in which the pixel electrode is disposed, wherein a length of a first width as a maximum value of a distance between two points on an arbitrary straight line extending along the first direction on the first region is longer than a length of a second width as a maximum value of the distance between two points on an arbitrary straight line extending along the second direction on the first region, and a length of a third width as a maximum value of a distance between two points on an arbitrary straight line extending along the first direction on the second region is longer than a length of a fourth width as a maximum value of the distance between two points on an arbitrary straight line extending along the second direction on the second region.

According to another exemplary embodiment of the disclosure, there is provided a liquid crystal display device. The liquid crystal display device comprising, a display region in which a plurality of pixels of a matrix array disposed adjacent to each other along a first direction facing right from left on a plane and a second direction intersecting with the first direction on the plane is disposed, a plurality of gate lines extending in the first direction on the display region, a plurality of data lines extending in the second direction on the display region, and a light shielding member disposed on the display region to overlap a partial region of each pixel and the plurality of gate lines, wherein the display region comprises a first sub-display region disposed on the left from the center, and a second sub-display region disposed on the right from the center, the respective pixels comprise a first region as a region in which a transistor connected to the gate line and the data line, and a contact hole for connecting the transistor and the and the pixel electrode are disposed, and a second region in which the pixel electrode is disposed, the light shielding member disposed to overlap a partial region of the pixel of the first sub-display region is formed in the same shape as the second region, and is disposed to be biased to the right from the second region, and the light shielding member disposed to overlap a partial region of the second sub-display region is formed in the same shape as the second region, and is disposed to be biased to the left from the second region.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
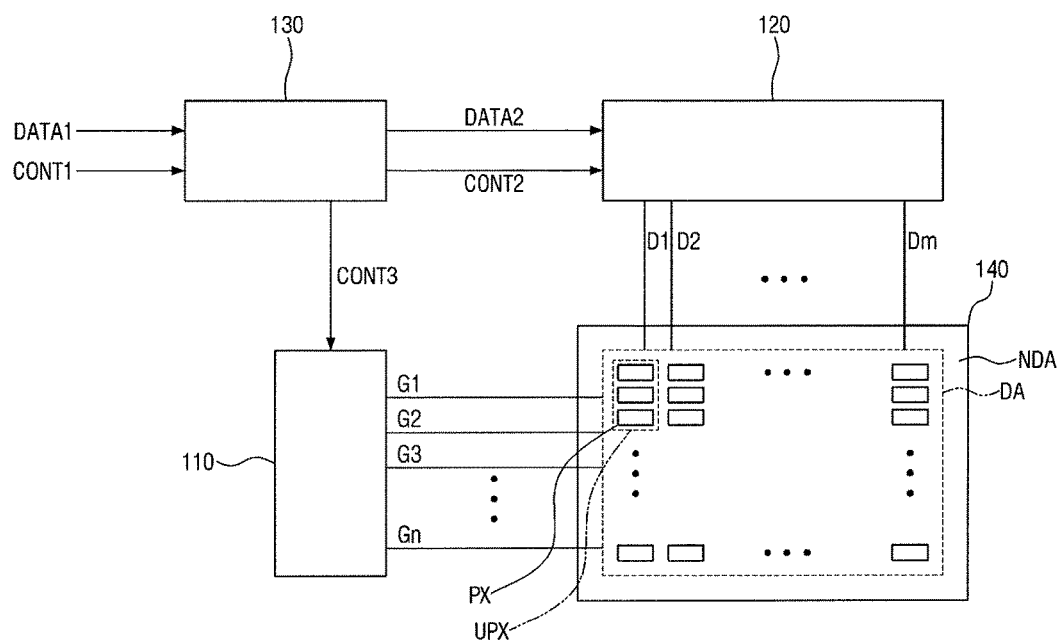
FIG. 1 illustrates a block diagram of a display device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the disclosure.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, preferred embodiments of the present disclosure will be described in detail with reference to the accompanying drawings.

FIG. 1 is a block diagram of a display device according to an embodiment of the present disclosure. As an example, FIG. 1 illustrates a liquid crystal display (LCD) device.

Referring to FIG. 1, a liquid crystal display device according to an embodiment may include a gate driver 110, a data driver 120, a signal controller 130, and a display panel 140.

The signal controller 130 receives various signals from outside to control the gate driver 110 and the data driver 120. For example, the signal controller 130 may receive a first image data DATA1 and an input control signal CONT1 from outside for controlling its display, and may output a gate driver control signal CONT3, a data driver control signal CONT2, a second image data DATA2, and the like.

The first image data DATA1 may include luminance information of each of the pixels PX. The luminance information may have, but is not limited to, a defined number, e.g., 1024 (=$2^{10}$), 256 (=$2^8$) or 64 (=$2^6$) gray scales, and may have other values. The input first image data DATA1 may be divided in units of frames.

The input control signal CONT1 transmitted to the signal controller 130 may include, e.g., a vertical synchronization signal Vsync, a horizontal synchronization signal Hsync, a main clock Mclk, a data enable signal DE, and the like. However, other types of signals may be additionally input, without being limited thereto.

The gate driver control signal CONT3 may be a signal that controls the operation of the gate driver 110, and may be generated by the signal controller 130. The gate driver control signal CONT3 may include a scan starting signal, a clock signal, and the like, and may further include other signals, without being limited thereto. The gate driver 110 may generate a gate signal capable of activating the display pixels PX in accordance with the gate driver control signal CONT3, and may provide the gate signal to the corresponding gate lines G1 to Gn.

The data driver control signal CONT2 may be a signal that controls the operation of the data driver 120, and may be generated by the signal controller 130. The data driver 120 may generate a data signal in accordance with the data driver control signal CONT2, and may transmit the data signal to the corresponding data line.

The display panel 140 includes a display region DA and a non-display region NDA. The pixels PX may be disposed in the display region, and components necessary for driving the pixels PX may be disposed in the non-display region NDA. For example, the components necessary for driving the pixels PX may correspond to the signal controller 130, the data driver 120, and the gate driver 110.

The pixel PX is a minimum unit that can control individual gray scales of the images, when displaying the images that are actually visually recognized by a user. The pixels PX may be arranged in the display region DA in the form of a matrix.

The data lines D1 to Dm and the gate line G1 to Gn may be disposed on the display panel 140. The data lines D1 to Dm may receive a gate signal from the gate driver 110, and may provide the gate signal to the corresponding pixel PX. The data lines D1 to Dm may receive the data signal from data driver 120, and may provide the data signal to the corresponding pixel PX.

Each pixel PX may be connected to one of the data lines D1 to Dn and one of the signal gate lines G1 to Gn, and the pixel PX may be controlled by the data signal provided from the data lines D1 to Dm and the gate signal supplied from the gate lines G1 to Gn. However, one of the data line D1 to Dm may be connected to a plurality of pixels PX, and one of the single gate lines G1 to Gn may be connected to a plurality of pixels PX.

Meanwhile, each of the pixels PX may uniquely display a single color of the primary colors to achieve the color display. Examples of the primary colors may include red, green and blue. In the specification, a pixel displaying red is referred to as a red pixel, a pixel displaying green is referred to as a green pixel, a pixel displaying blue is referred to as a blue pixel, and a pixel displaying white is referred to as a white pixel The red pixels, the green pixels, and the blue pixels disposed consecutively may be gathered to form a single upper pixel UPX. The upper pixel UPX may be formed by gathering of three pixels PX, and each of the three gathered pixels PX may display only one of red, green, and blue colors, but a single upper pixel UPX may display an arbitrary color. Here, the arbitrary color means all of various colors capable of being displayed by combining red display in the red pixel, green displayed in the green pixel, and blue displayed in the blue pixel.

It is possible to consider a case where one of the data lines D1 to Dm and the three gate lines G1 to Gn are required to control the operation of a single upper pixel UPX, and a case where one of the gate lines G1 to Gn and the three data lines D1 to Dm are required to control the control of a single upper pixel UPX. However, in the former case, the manufacturing cost of the LCD device may be lower than the case of the latter. For example, as the number of data lines D1 to Dm required for the LCD device is increased, the manufacturing cost of the data driver 120 increases, and as the number of the gate lines G1 to Gn required for the LCD device is increased, the manufacturing cost of the gate driver 110 may increase. However, in general, an increased width of the manufacturing cost of the gate driver 110 with an increased number of the gate lines G1 to Gn may be smaller than an increased width of the manufacturing cost of the data driver 120 with an increased number of data lines D1 to Dm.

Thus, in this embodiment, a single upper pixel UPX may be connected to one of the data lines D1 to Dm and the three gate lines G1 to Gn. However, for these connection structures, the width of each pixel PX contained in the upper pixel UPX may be formed long in a specific direction. This will be described below in more detail.

Figure 2:
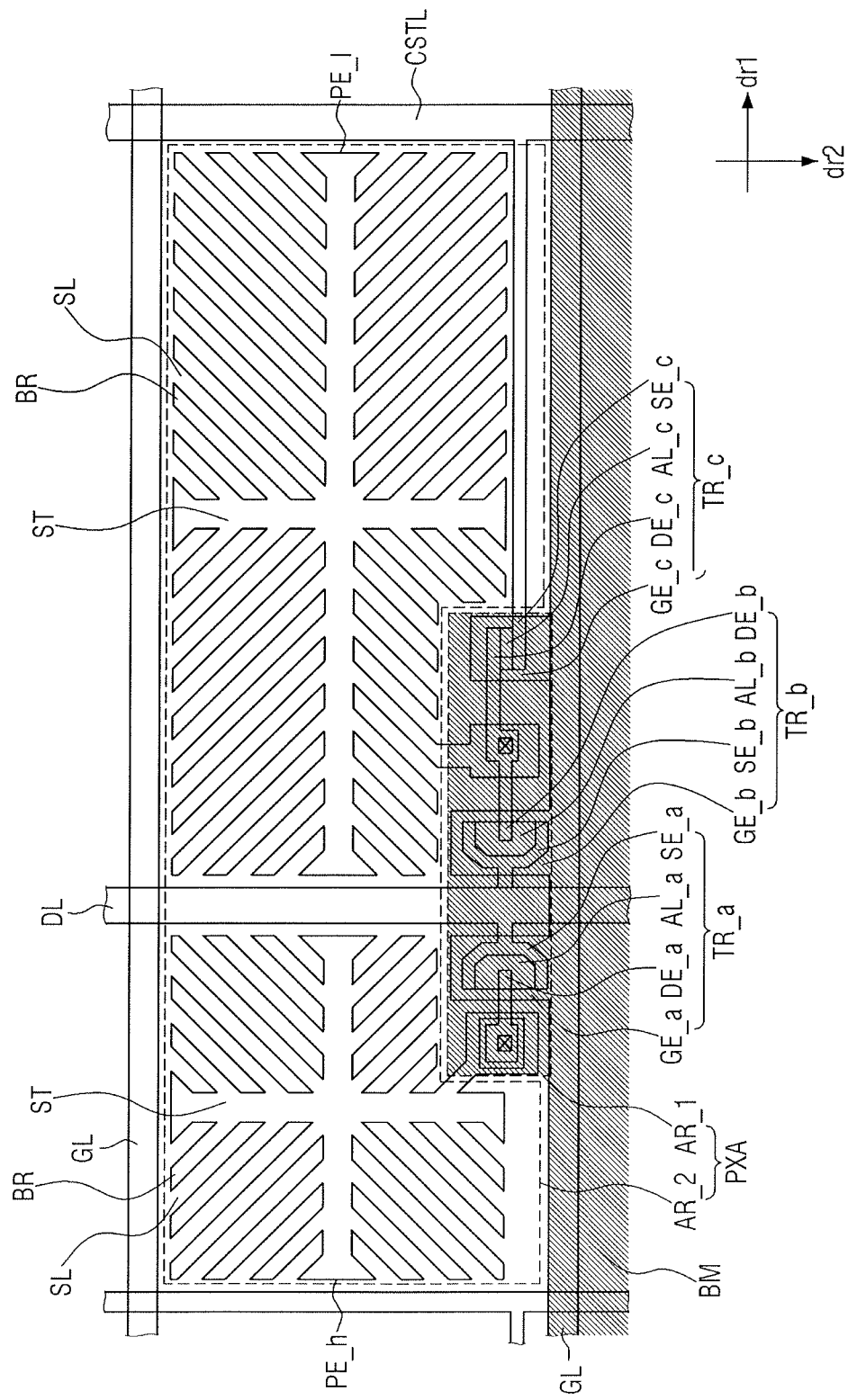
FIG. 2 illustrates a layout diagram of a single pixel of a display panel of the display device in FIG. 1.
Figure 3:
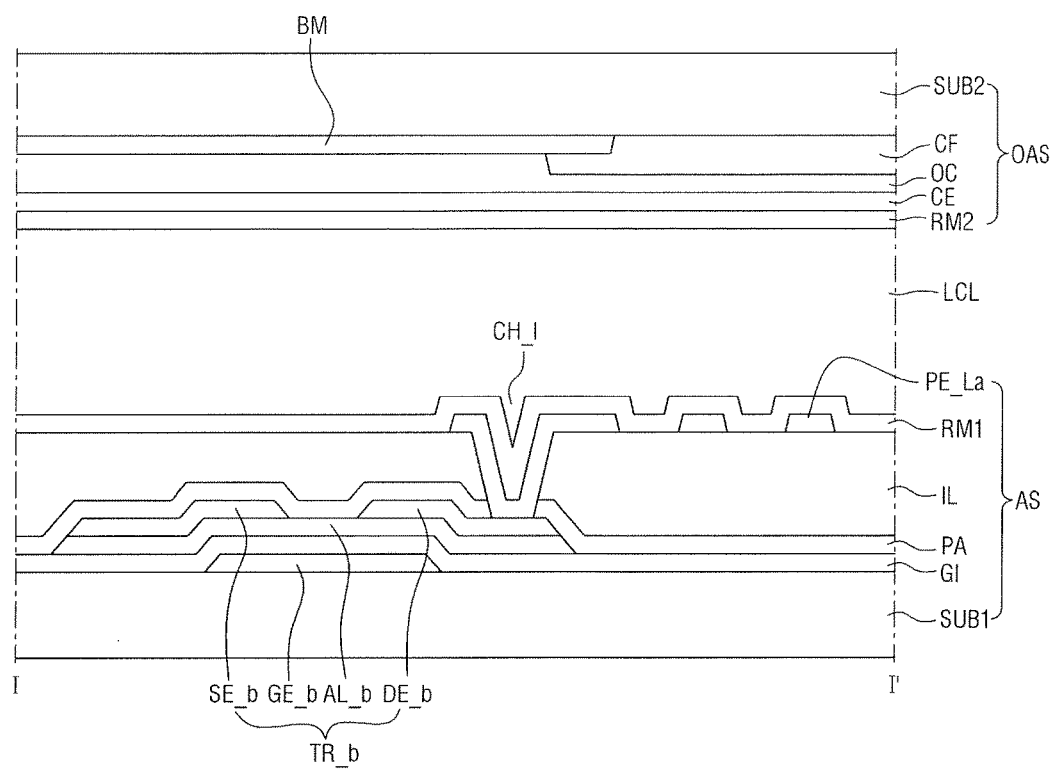
FIG. 3 illustrates a cross-sectional view taken along line IT of FIG. 2.
Figure 4:
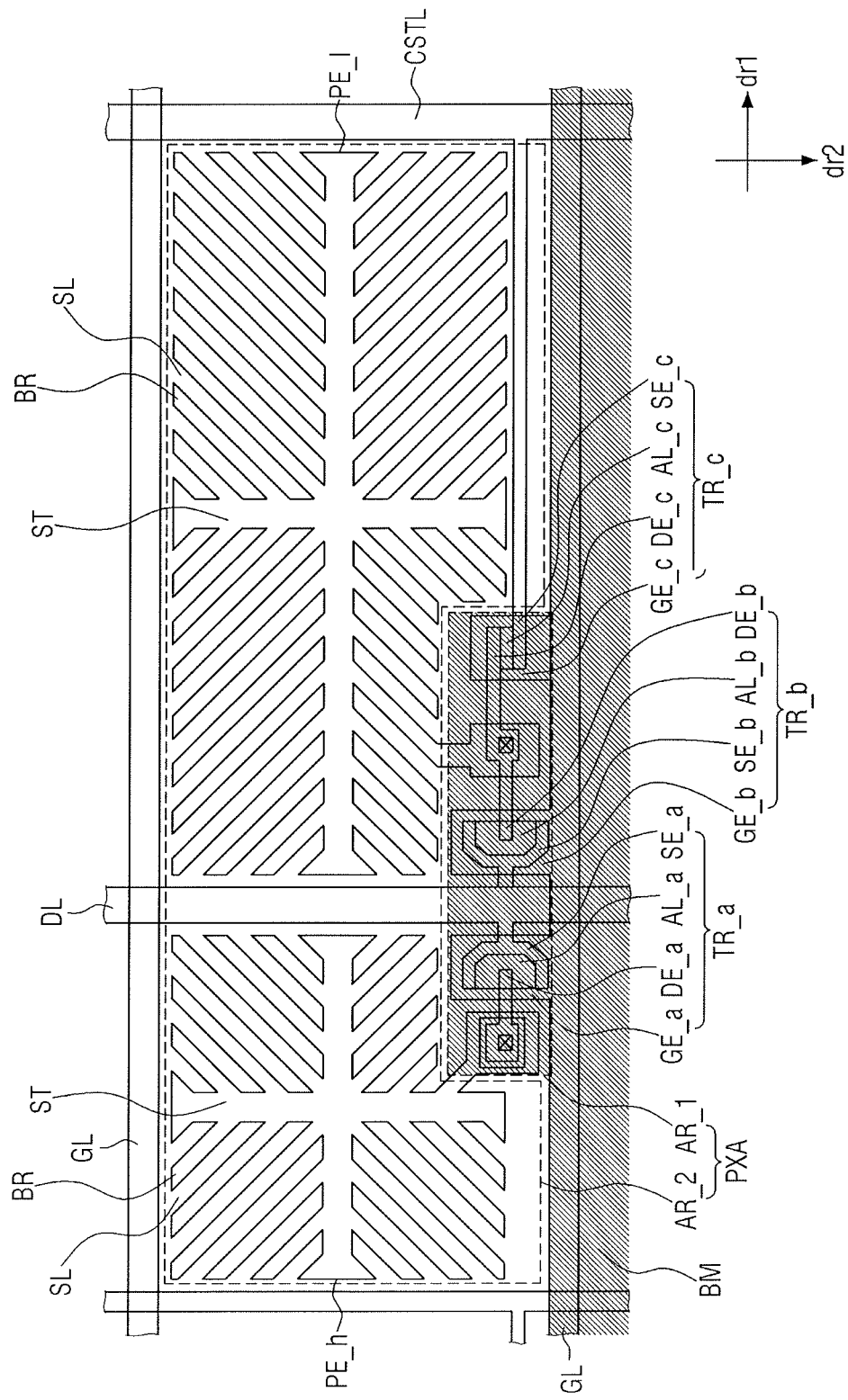
FIG. 4 illustrates a layout diagram of a single pixel of the display panel of the display device in FIG. 1 with an additionally illustrated light shielding member.

FIG. 2 is a layout diagram of a single pixel of the display panel 140, FIG. 3 is a cross-sectional view taken along line I-I' of FIG. 2, and FIG. 4 is a layout diagram in which a shielding member is additionally illustrated in the single pixel of the display panel 140. Referring to FIGS. 2 to 4, the display panel 140 according to the present embodiment may include an array substrate AS, a counter substrate OAS, and a liquid crystal layer LCL.

Referring to FIG. 3, the array substrate AS is formed with a transistor TR for driving the liquid crystal molecules of the liquid crystal layer LCL, and the counter substrate OAS is a substrate disposed opposite to the array substrate AS. Hereinafter, the array substrate AS will be described.

The array substrate AS may include a first base substrate SUB1. The first base substrate SUB1 may be a transparent insulating substrate. For example, the first base substrate SUB1 may be made of, e.g., a glass substrate, a quartz substrate, a transparent resin substrate and the like. Further, the first base substrate SUB1 may also include, e.g., a polymer or a plastic having a high heat resistance.

In some embodiments, the first base substrate SUB1 may also have flexibility. That is, the first base substrate SUB1 may be a substrate capable of being deformed by rolling, folding, bending or the like, and it is also possible to manufacture the curved surface display device, using the first base substrate.

Referring to FIG. 2, a gate line GL, a first gate electrode GE_a, second gate electrode GE_b, and a third gate electrode GE_c may be disposed on the first base substrate SUB1. The gate line GL may transmit the gate signals and may extend in a first direction.

Here, the first direction dr1 corresponds to a direction which extends to be parallel to one side of the first base substrate SUB1, and as illustrated in FIG. 2, the first direction dr1 may be defined as a direction indicated by the arbitrary straight line extending from left to right. However, the embodiment is not limited thereto, and the first direction does not necessarily need to be parallel to the one side of the first base substrate SUB1, and may also be a direction indicated by an arbitrary straight line extending in a specific direction on the first base substrate SUB1.

The gate signal may be a signal having a varying voltage value provided from the outside, and the turning on/off of first to third transistors TR_a, TR_b and TR_c described below may be controlled depending on the voltage value of the gate signal.

The first to third gate electrodes GE_a, GE_b and GE_c may be formed in a shape protruding from the gate line GL, and may be one of the components forming the first to third transistors TR_a, TR_b and TR_c which will be described later. In a single gate line GL, a plurality of the first gate electrodes GE_a, a plurality of the second gate electrodes GE_b, and a plurality of the third gate electrodes GE_c may be formed. The arrangement of the first to third gate electrodes GE_a, GE_b, and GE_c will be described in more detail below with reference to the description of the first to the third transistors TR_a, TR_b, and TR_c.

The gate line GL and the first to third gate electrodes GE_a, GE_b, and GE_c may contain an aluminum-based metal, e.g., aluminum (Al) or aluminum alloy, a silver-based metal, e.g., silver (Ag) or a silver alloy, a copper-based metal, e.g., copper (Cu) or a copper alloy, a molybdenum-based metal, e.g., molybdenum (Mo) or a molybdenum alloy, chromium (Cr), tantalum (Ta), and titanium (Ti). The gate line GL and the first to third gate electrodes GE_a, GE_b, and GE_c may have a single layer structure or may also have a multilayer structure including at least two conductive layers with different physical properties. For example, a single conductive film may be made of a low-resistance metal, e.g., an aluminum-based metal, a silver-based metal, a copper-based metal, or the like, to reduce the signal delay or the voltage drop of the gate line GL and the first to third gate electrodes GE_a, GE_b and GE_c. In another example, other conductive films may be formed of other materials, e.g., materials with excellent contact characteristics with indium tin oxide (ITO) and indium zinc oxide (IZO), such as a molybdenum-based metal, chromium, titanium, tantalum or the like. Examples of these combinations may be a lower chromium film and an upper aluminum film, and a lower aluminum film and an upper molybdenum film. However, the present disclosure is not limited thereto, and the gate line GL and the first to third gate electrodes GE_a, GE_b and GE_c may be formed of various several metals and conductors.

A gate insulating film GI may be disposed on the gate line GL and the first to third gate electrodes GE_a, GE_b and GE_c. The gate insulating film GI may be made of an insulating material, e.g., silicon nitride or silicon oxide. The gate insulating film GI may be made of a single layer structure or may have a multilayer structure including two insulating layers with different physical properties.

First to the third semiconductor layers AL_a, AL_b, and AL_c may be disposed on the gate insulating film GI. The first semiconductor layer AL_a may at least partially overlap the first gate electrode GE_a, the second semiconductor layer AL_b may at least partially overlap the second gate electrode GE_b, and the third semiconductor layer AL_c may at least partially overlap the third gate electrode GE_c. The semiconductor layers AL_a, AL_b, and AL_c may include, e.g., amorphous silicon, polycrystalline silicon, or oxide semiconductor. The first to third semiconductor layers AL_a, AL_b and AL_c overlap each of the corresponding first to third gate electrodes GE_a, GE_b, and GE_c, and may be disposed to overlap at least a part or all of a data line DL, a source electrode SE, or a drain electrode DE to be described later, depending on the processes.

In some embodiments, an ohmic contact layer may be further disposed over the first to third semiconductor layers AL_a, AL_b, and AL_c. The ohmic contact member may be formed of n+hydrogenated amorphous silicon doped with n-type impurities at high density, or silicide. The ohmic contact member may be disposed over the first to third semiconductor layers AL_a, AL_b, and AL_c in pairs. In some embodiments, when the first to third semiconductor layers AL_a, AL_b, and AL_c are oxide semiconductor, the ohmic contact member may be omitted.

The data line DL, the first to third source electrodes SE_a, SE_b, and SE_c, the first to third drain electrodes DE_a, DE_b, and DE_c, and the storage line CSTL are disposed on the first to third semiconductor layers AL_a, AL_b, and AL_c, and the gate insulating film GI. The data line DL may extend in a second direction dr2 to intersect with the gate line GL.

Here, the second direction dr2 may be a direction perpendicularly intersecting with the first direction dr1. As illustrated in FIG. 2, the second direction may be a direction indicated by an arbitrary straight line extending toward the lower side from the upper side. However, the embodiment is not limited thereto, and an angle formed between the second direction dr2 and the first direction dr1 may not be vertical, and in this case, the second direction dr2 may also be a direction indicated by a straight line that extends not to parallel the first direction dr1.

The data line DL may be insulated from the gate line GL by the gate insulating film GI. The data line DL may provide a data signal input from the outside to the first and second source electrodes SE_a and SE_b. Here, the data signal may be a signal having a varying voltage value provided from the outside, and the gray scales of each pixel PX may be controlled to correspond to the data signal.

Referring to FIG. 2, the first source electrode SE_a branches from the data line DL, and may at least partially overlap the first gate electrode GE_a. In addition, the second source electrode SE_b branches from the data line DL, and may be at least partially overlap the second gate electrode GE_b.

The storage line CSTL may extend in the second direction dr2 to intersect with the gate line GL. The storage line CSTL may be formed of the same material on the same layer as the data line DL, and may be disposed so as not to overlap the data line DL. However, the storage line CSTL may further include a section that extends in the first direction dr1 for connection with a third source electrode SE_c to be described later. The storage line CSTL may be insulated from the gate line GL by the gate insulating film GI.

The storage line CSTL may provide a storage signal input from the outside to the third source electrode SE_c. Here, the storage signal may be a signal having a constant voltage value that is provided from the outside, and may be a signal having a voltage value that is smaller than the maximum voltage value of the data signal and is greater than the minimum voltage value. The third source electrode SE_c branches from the storage line CSTL and may at least partially overlap the third gate electrode GE_c.

The first drain electrode DE_a may be disposed to be spaced apart from the first source electrode SE_a with the first semiconductor layer AL_a interposed therebetween, and at least partially overlap the first gate electrode GE_a. Further, the second drain electrode DE_b may be disposed to be spaced apart from the second source electrode SE_b with the second semiconductor layer AL_b interposed therebetween, and may at least partially overlap the second gate electrode GE_b. Further, the third drain electrode DE_c may be disposed to be spaced apart from the third source electrode SE_c with the third semiconductor layer AL_c interposed therebetween, and at least partially overlap the third gate electrode GE_c. In this case, as illustrated in FIG. 2, the first source electrode SE_a may be formed to surround the first drain electrode DE_a in a "U" shape at regular intervals. Similarly, the second source electrode SE_b may be formed to surround the second drain electrode DE_b in a "U" shape at regular intervals. However, the third source electrode SE_c may be disposed to be spaced apart in parallel to the third drain electrode DE_c at regular intervals.

The shapes of the first to third source electrode SE_a, SE_b, and SE_c and the first to third drain electrodes DE_a, DE_b, and DE_c as described above are examples, and are not limited thereto. For example, the third source electrode SE_c may also be formed to surround the third drain electrode DE_c in a "U" shape at regular intervals.

The first semiconductor layer AL_a may be disposed in a region between the first source electrode SE_a and the first drain electrode DE_a formed by the first source electrode SE_a and the first drain electrode DE_a spaced apart from each other. That is, the first source electrode SE_a and the first drain electrode DE_a partially overlap or are in contact with the first semiconductor layer AL_a, and may be disposed to face each other with the first semiconductor layer AL_a interposed therebetween.

Similarly, the second semiconductor layer AL_b may be disposed in a region between the second source electrode SE_b and the second drain electrode DE_b formed by the second source electrode SE_b and the second drain electrode DE_b spaced apart from each other. That is, the second source electrode SE_b and the second drain electrode DE_b partially overlap or are in contact with the second semiconductor layer AL_b, and may be disposed to face each other with the second semiconductor layer AL_b interposed therebetween.

Further, the first semiconductor layer AL_c may be disposed in a region between the third source electrode SE_c and the third drain electrode DE_c formed by the third source electrode SE_c and the third drain electrode DE_c spaced apart from each other. That is, the third source electrode SE_c and the third drain electrode DE_c partially overlap or are in contact with the third semiconductor layer AL_c, and may be disposed to face each other with the third semiconductor layer AL_c interposed therebetween.

The data line DL, the storage line CSTL, the first to third source electrodes SE_a, SE_b, and SE_c, and the first to third drain electrodes DE_a, DE_b, and DE_c may be formed of, e.g., aluminum, copper, silver, molybdenum, chromium, titanium, tantalum or an alloy thereof. Further, they may have, but are not limited to, a multilayer structure made of a lower film. e.g., a refractory metal and a low-resistance upper film formed thereon.

A first transistor TR_a is formed by the first gate electrode GE_a, the first semiconductor layer AL_a, the first source electrode SE_a, and the first drain electrode DE_a. Further, a second transistor TR_b is formed by the second gate electrode GE_b, the second semiconductor layer AL_b, the second source electrode SE_b, and the second drain electrode DE_b. In addition, a third transistor TR_c is formed by the third gate electrode GE_c, the third semiconductor layer AL_c, the third source electrode SE_c, and the third drain electrode DE_c.

The first transistor TR_a may electrically connect the first source electrode SE_a and the first drain electrode DE_a to each other to correspond to the voltage value of the gate signal supplied to the first gate electrode GEa. For example, when the voltage value of the gate signal supplied to the first gate electrode GE_a corresponds to a voltage value that turns off the first transistor TR_a, the first source electrode SE_a and the first drain electrode DE_a may be electrically insulated from each other. When the voltage value of the gate signal supplied to the first gate electrode GE_a corresponds to a voltage that turns on the first transistor TR_a, the first source electrode SE_a and the first drain electrode DE_a are electrically connected to each other through a channel formed in the first semiconductor layer AL_a disposed therebetween.

The channel may be formed in the region of the first semiconductor layer AL_a between the first source electrode SE_a and the first drain electrode DE_a. That is, when the first transistor TR_a is in an on-state, the channel is formed around the first semiconductor layer AL_a disposed in the region between the first source electrode SE_a and the first drain electrode DE_a, and the voltage is transmitted and the current can flow along the channel.

As a result, the data signal provided to the data line DL may be transmitted to a first sub-pixel electrode PE_h connected to the first drain electrode DE_a through the first drain electrode DE_a, and the transmission or non-transmission of the data signal may be controlled by the gate signal provided on the gate line GL. The first sub-pixel electrode PE_h will be specifically described below.

Similarly, the second transistor TR_b may electrically connect the second source electrode SE_b and the second drain electrode DE_b to correspond to the voltage value of the gate signal supplied to the second gate electrode GE_b. Accordingly, the data signal provided to the data line DL may be transmitted to a second sub-pixel electrode PE_l connected to the second drain electrode DE_b through the second drain electrode DE_b. The second sub-pixel electrodes PE_h will be specifically described below.

Further, the third transistor TR_c may electrically connect the third source electrode SE_c and the third drain electrode DE_c to correspond to the voltage value of the gate signal supplied to the third gate electrode GE_c. Accordingly, the storage signal provided to the storage line CSTL may be transmitted to the second sub-pixel electrode PE_l connected to the third drain electrode DE_c through the third drain electrode DE_c.

Here, unlike the first sub-pixel electrode PE_h that only receives the data signal from the first drain electrode DE_a, the second sub-pixel electrode PE_l may receive the data signal from the second drain electrode DE_b and may receive the storage signal from the third drain electrode DE_c. Accordingly, although the first sub-pixel electrode PE_h receives a voltage value corresponding to the data signal, a voltage value between the voltage value of the data signal and the voltage value of the storage signal may be provided to the second sub-pixel electrode PE_l.

Here, the one voltage value between the voltage value of the data signal and the voltage value of the storage signal means any one voltage value of the voltage values smaller than the voltage value of the data signal and greater than the voltage value of the storage signal, when the voltage value of the data signal is greater than the voltage value of the storage signal. Further, the one voltage value means any one voltage value of the voltage values greater than the voltage value of the data signal and smaller than the voltage value of the storage signal, when the voltage value of the data signal is smaller than the voltage value of the storage signal. Further, the one voltage value between the voltage value of the data signal and the voltage value of the storage signal may be determined to correspond to the spaced shape of the second source electrode SE_b and the second drain electrode DE_b, and the spaced shape of the third source electrode SE_c and the third drain electrode DE_c. Since the first to third transistors in TR_a, TR_b, and TR_c are included in a single pixel PX, and the different voltage values are finally applied to the first sub-pixel electrode PE_h and the second sub-pixel pixel electrode PE_l accordingly, it is possible to improve the visibility of the display device.

A passivation film PA may be disposed on the gate insulating film GI and the first to third transistors TR_a, TR_b, and TR_c. The passivation film PA may be made of an organic insulating material or an inorganic insulating material, and may cover the first to third transistors TR_a, TR_b and TR_c a.

A flattening film IL may be disposed on the passivation film PA. The flattening film IL may have a function of flattening the top of the passivation film PA. The flattening film IL may be made of an organic material. The flattening film IL may be made of a photosensitive organic composition, and an additional photosensitive organic composition may be further formed at the bottom of the flattening film IL, without being limited thereto. Further, the flattening film IL may also be made of a material that contains pigments for achieving color, and a photosensitive organic composition layer containing the pigment for achieving the color may be additionally formed at the bottom of another flattening film IL. For example, the flattening film IL may also contain any one of red, green or blue pigment in the photosensitive organic composition. That is, the insulating film IL may also have the function of a color filter CF which will be described later.

First and second contact holes CH_h and CH_l may be formed on, e.g., through, the flattening film IL and the passivation film PA, and a part of the thin film transistor. In detail, some of the first to third drain electrodes DE_a, DE_b, and DE_c may be exposed through the first and second contact holes.

In further detail, the first contact hole CH_h may vertically penetrate the flattening film IL and the passivation film PA. The first contact hole CH_h exposes a part of the first drain electrode DE_a, and may be formed to overlap a part of the first drain electrode DE_a. A part of the first drain electrode DE_a and the first sub-pixel electrode to be described later PE_h disposed on the flattening film IL may be physically and electrically connected to each other through a conductive material formed inside the first contact hole CH_h. Here, the conductive material formed inside the first contact hole CH_h may be a part of the first sub-pixel electrode PE_h which will be described later.

Further, the second contact hole CH_l may also vertically penetrate the flattening film IL and the passivation film PA. The second contact hole CH_l exposes some of the second drain electrode DE_b and the third drain electrode DE_c, and may be formed to overlap some of the second drain electrode DE_b and the third drain electrode DE_c. A part of the second drain electrode DE_b, a part of the third drain electrode DE_c, and the second sub-pixel pixel electrodes PE_l to be described later disposed on the flattening film IL may be physically and electrically connected to one another through the conductive material formed within the second contact hole CH_l. Here, the conductive material formed inside the second contact hole CH_l may be a part of the second sub-pixel electrode PE_l which will be described later.

The first sub-pixel electrode PE_h and the second sub-pixel pixel electrode PE_l may be disposed on the flattening film IL. The first sub-pixel electrode PE_h may be physically connected to the first drain electrode DE_a through the first contact hole CH_h to receive the voltage from the first drain electrode DE_a. Further, the second sub-pixel pixel electrode PE_l may be physically connected to the second and third drain electrodes DE_b and DE_c through the second contact hole CH_l to receive the voltage from the second and third drain electrodes DE_b and DE_c.

The first sub-pixel electrode PE_H and the second sub-pixel electrode PE_L may be made of a transparent conductive material, e.g., indium tin oxide (ITO), indium zinc oxide (IZO), indium tin zinc oxide (ITZO) and Al-doped zinc oxide (AZO). The first and second sub-pixel electrodes PE_h and PE_l may include a stem electrode ST formed in a "+" shape, and a plurality of branch electrodes BR extending from the stem electrode ST. Each of the first and second sub-pixel electrodes PE_h and PE_l may be divided into a plurality of domains by the stem electrode ST. As an example, as illustrated in FIG. 2, the first sub-pixel electrode PE_h may be divided into four quadrants by the stem electrode ST, and each of the quadrants may correspond to one domain. At this time, the extending directions of the branch electrodes BR may be different from each other for each domain. The branch electrodes BR may also be disposed in parallel and spaced apart from each other at intervals, and a slit SL as an opening in which the transparent conductive material is not formed may be formed between adjacent branch electrodes BR. Since branch electrodes BR within a same domain are disposed in parallel and spaced apart from each other at intervals, the slits SL may also be disposed in parallel and spaced apart from each other at intervals.

Each of the pixels PX is disposed in the pixel region PXA. The pixel region PXA is defined as a region that includes first and second region AR_1 and AR_2. The first region AR_1 is a region including components for controlling the liquid crystal molecules, e.g., the region including the transistors on both sides of the data line DL in FIG. 2. The second region AR_2 is a region including the liquid crystal molecules, e.g., the region including the branch electrodes BR of the pixel electrodes in FIG. 2, which are controlled by different data signals at different timings.

The components for controlling the liquid crystal molecules may include the first to third transistors TR_a, TR_b, and TR_c disposed in the pixel PXa. That is, the pixel region PXA includes the first region AR_1 and the second region AR_2. Further, since the liquid crystal molecules are controlled by an electric field formed by the first sub-pixel electrode PE_h and the second sub-pixel electrode PE_l, the second region AR_2 may be the same as the region in which the first and second sub-pixel electrodes PE_h and PE_l are disposed, e.g., the second region AR_2 may be the region including the first and second sub-pixel electrodes PE_h and PE_l.

The width of the second region AR_2 extending in the first direction dr1 is formed longer than the width extending in the second direction dr2. Here, the width of the second region AR_2 extending in the first direction dr1 refers to a distance between two points, when the distance between the two points on an arbitrary straight line along the first direction dr1 on an arrangement plane of the second region AR_2 has a maximum value. Similarly, the width of the second region AR_2 extending in the second direction dr2 refers to a distance between two points, when the distance between the two points on an arbitrary straight line extending along the second direction dr2 on an arrangement plane of the second region AR_2 has a maximum value. For example, the width of the second region AR_2 in the first direction dr1 may be measured from an outermost edge of the first sub-pixel electrode PE_h (left in FIG. 2) to an outermost edge of the second sub-pixel electrode PE_l (right in FIG. 2), and the width of the second region AR_2 in the second direction dr2 may be measured between opposite edges of the second sub-pixel electrode PE_l along the second direction dr2 (e.g., area surrounded by dashed line above the gray area in FIG. 4).

Also, the width of the second region AR_2 extending in the first direction dr1 is formed longer than the width extending in the second direction dr2, the display colors of the pixels PX consecutively disposed along the first direction dr1 are identical to each other, and the display colors of the pixels PX consecutively disposed along the second direction dr2 may be different from each other. For example, each of the pixels PX consecutively disposed in the second direction dr2 may be disposed so that the red pixel, the green pixel, and the blue pixel are alternately repeated, and any one of the red pixel, the green pixel, and blue pixel may be consecutively disposed in each of the pixels PX consecutively disposed in the first direction dr1. In this case, the three pixels PX consecutively disposed along the second direction dr2, i.e., the red pixels, the green pixels, and the blue pixels consecutively disposed along the second direction dr2, may be gathered one by one to form a single upper pixel UPX.

However, the embodiment is not limited thereto. For example, pixels displaying other colors other than red, green, and blue may also be additionally disposed, and white pixels which do not display color may also be disposed, and the pixels may be gathered to become a basic unit for displaying a single color. When the width of the second region AR_2 extending in the first direction dr1 is formed longer than the width extending in the second direction dr2, although the number of pixels disposed in the second direction dr2 increases, the number of pixels disposed along the first direction dr1 decreases correspondingly. Thus, although the number of gate lines GL extending in the first direction dr1 increases, the number of data lines DL extending along the second direction dr2 decreases correspondingly. As a result, although the request capacity of the gate driver 110 for providing the gate signal to the gate line GL increases, the request capacity of the data driver 120 for providing the data signal to the data line DL decreases correspondingly, and thus, the manufacturing cost of the liquid crystal display device is reduced, as described above referring to FIG. 2.

A first alignment film RM1 may be disposed on the first sub-pixel electrode PE_h and the second sub-pixel electrode PE_l. The first alignment film RM1 may pre-tilt the liquid crystal molecules disposed on a liquid crystal layer LCL to be described later. That is, the first alignment film RM1 may align the liquid crystal molecules to point the direction that forms an angle of 0.5° to 3° in a constant direction from a direction perpendicular to the plane on which the first alignment film RM1 is formed in a state in which the electric field is not applied to the liquid crystal layer LCL. However, the first alignment film RM1 may also be omitted. It is also possible to form the pre-tilt due to the physical properties themselves of the liquid crystal molecules, rather than the pre-tilt of the first alignment film RM1.

Hereinafter, the counter substrate OAS will be described. The counter substrate may include a second base substrate SUB2, a light shielding member BM, a common electrode CE, an overcoat layer OC and a second alignment film RM2. The second base substrate SUB2 is disposed to face the first base substrate SUB1. The second base substrate SUB2 may have durability capable of withstanding impact from the outside. The second base substrate SUB2 may be a transparent insulating substrate. For example, the second base substrate SUB2 may be made of, e.g., a glass substrate, a quartz substrate, a transparent resin substrate like. Further, the second base substrate SUB2 may also include. e.g., a polymer or a plastic having a high heat resistance. The second base substrate SUB2 may be a flat plate type, but it may also be curved in a particular direction. In some embodiments, the second base substrate SUB2 may also have flexibility. That is, the second base substrate SUB2 may be a substrate capable of being deformed by rolling, folding, bending or the like.

The light shielding member BM may be disposed on the second base substrate SUB2 (in the lower part in the drawings). The light shielding member BM may be disposed to overlap the first region AR_1 and the gate line GL of each pixel, as illustrated in FIG. 4, thereby preventing light leakage due to misalignment of the liquid crystal molecules.

The width of the first region AR_1 extending in the first direction dr1 is formed longer than the width extending in the second direction dr2. Here, the width of the first region AR_1 extending in the first direction dr1 refers to a distance between two points, when the distance between the two points on the arbitrary straight line along the first direction dr1 on the arrangement plane of the first region AR_1 has the maximum value. Similarly, the width of the first region AR_1 extending in the second direction dr2 refers to a distance between two points, when the distance between the two points on the arbitrary straight line extending along the second direction dr2 on the arrangement plane of the first region AR_1 has the maximum value. For example, the width of the first region AR_1 in the first direction dr1 may be measured from an outermost edge of the first contact hole CH_h (left in FIG. 2) to an outermost edge of the third transistor TR_c (right in FIG. 2), and the width of the first region AR_1 in the second direction dr2 may be measured between opposite edges of the transistors along the second direction dr2 (e.g., area surrounded by dashed line in FIGS. 2 and 4).

In this case, when forming the light shielding member BM, even if some errors occur as compared to the intended arrangement along the first direction dr1, in an area in which the error occurs, an error may occur by an area obtained by multiplying an occurrence length of an error along the first direction dr1 by a length of the width of the first region AR_1 extending in the second direction dr2. That is, since the length of one side of the occurrence area of the error corresponds to the width of the first region AR_1 extending in the second direction dr2, rather than the width of the first region AR_1 extending in the first direction dr1, an area of the region in which the error occurs may be minimized.

The color filter CF may be disposed on the second base substrate SUB2 and the light shielding member BM (in the lower part in the drawings). The color filter CF may make light incident from the outside of the first base substrate SUB1 and emitted to the outside of the second base substrate SUB2 have a particular color. The color filter CF may be made of a photosensitive organic composition containing the pigment for achieving color, and may contain any one of red, green, or blue pigment.

An overcoat layer OC may be disposed on the light shielding member BM and the color filter CF (in the lower part in the drawings). The overcoat layer OC may reduce a level difference caused by the light shielding member BM and the color filter CF. The overcoat layer OC may be omitted as needed in some embodiments.

A common electrode CE may be disposed on the overcoat layer OC (in the lower part in the drawings). However, when the overcoat layer OC is omitted, the common electrode CE may be disposed on the light shielding member BM and the color filter CF. The common electrode CE may be made of a transparent conductive material, and may be entirely formed over the entire surfaces of the second base substrate SUB2. A common signal is applied to the common electrode CE, and may form an electric field together with the first sub-pixel electrode PE_h and the second sub-pixel pixel electrodes PE_l.

A second alignment film RM2 may be disposed on the common electrode CE (in the lower part in the drawings). The second alignment film RM2 may have the function similar to the first alignment film RM1 described above. That is, the second alignment film RM2 may pre-tilt the liquid crystal molecules disposed on the liquid crystal layer LCL. Hereinafter, the liquid crystal layer LCL will be described.

The liquid crystal layer LCL may include a plurality of liquid crystal molecules having a dielectric anisotropy. The liquid crystal molecules may be vertical alignment type liquid crystal molecules arranged in a direction perpendicular to the substrate between the array substrate AS and the counter substrate OAS. When an electric field is applied between the array substrate AS and the counter substrate OAS, the liquid crystal molecules may rotate in a particular direction between the array substrate AS and the counter substrate OAS to transmit or block the light. The expression "the liquid crystal molecules rotate" may include the meaning that the orientation of the liquid crystal molecules changes by the electric field, as well as the meaning that the liquid crystal molecules actually rotate.

Figure 5:
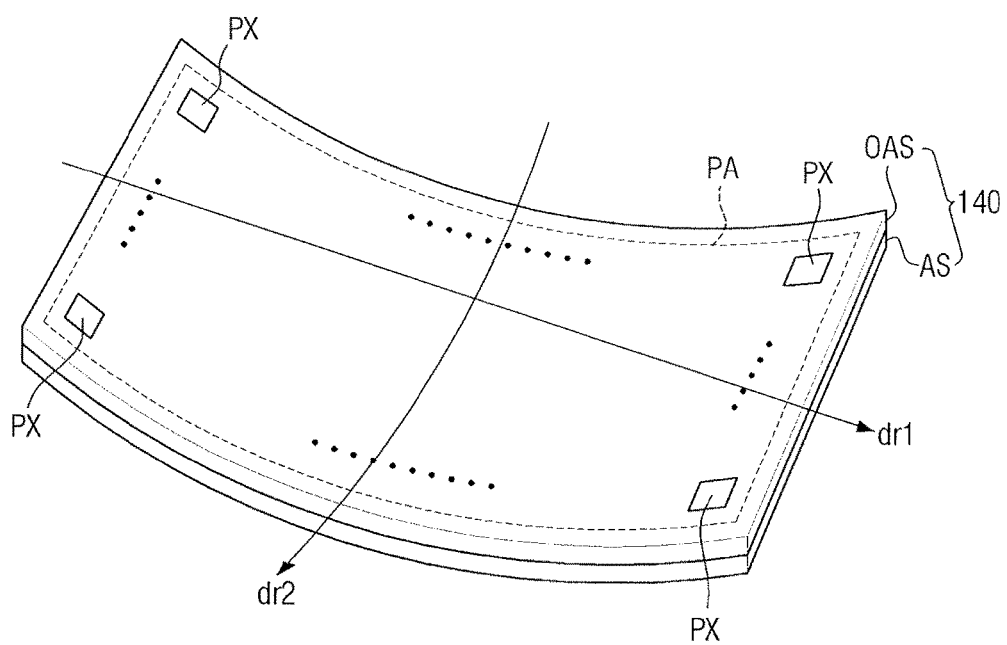
FIG. 5 illustrates a perspective view of a display panel according to another embodiment of the present disclosure.
Figure 6:
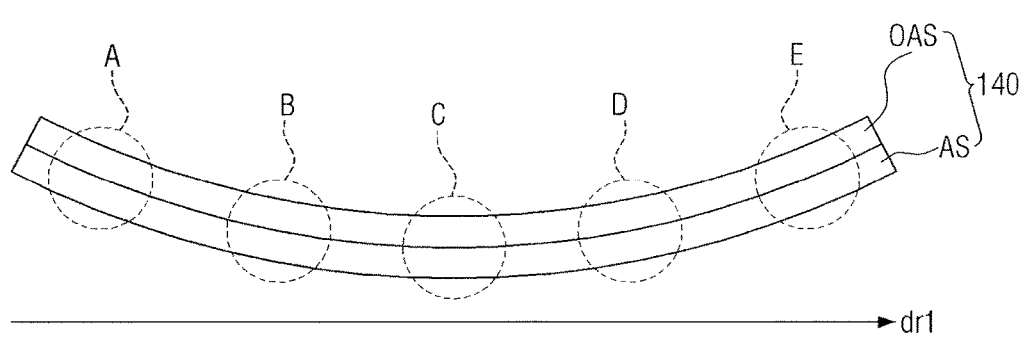
FIG. 6 illustrates a side view of the display panel illustrated in FIG. 5.

FIG. 5 is a perspective view of a display panel according to another embodiment of the present disclosure, and FIG. 6 is a side view of the display panel illustrated in FIG. 5.

Referring to FIGS. 5-6, the display panel 140 may include the array substrate AS, the counter substrate OAS facing the array substrate AS, and the liquid crystal layer LCL interposed between the array substrate AS and the counter substrate OAS. The array substrate AS and the counter substrate OAS may have a curved shape along a particular direction. More specifically, as illustrated in FIGS. 5 and 6, they may have a shape curved along the first direction dr1 to have a constant curvature around an arbitrary straight line extending in the second direction dr2 as an axis. Thus, the array substrate AS and the counter substrate OAS may have a curved shape in a cross-section taken along the first direction dr1, as illustrated in FIG. 6.

The embodiment is not limited thereto, and the array substrate AS and the counter substrate OAS may also have a shape curved along the second direction dr2 to have a constant curvature around an arbitrary straight line extending in the first direction dr1 as an axis.

In the case of the display device having a curved shape, it may be subjected to a process of being bent into a curved line, after it is manufactured to have a planar shape in the initially manufactured state. However, in the process of bending the counter substrate OAS and the array substrate AS to a curved shape, since the liquid crystal layer LCL is disposed between the counter substrate OAS and the array substrate AS as described above, the arrangement of the components included in the counter substrate OAS and the array substrate AS may be different from a case of having a planar shape, by a distance difference between the substrates.

For example, in the case of the light shielding member BM included in the counter substrate OAS, the light shielding member BM needs to be disposed to overlap the components forming the gate line GL and the first to third transistors TR_a, TR_b, and TR_c included in the array substrate AS, i.e., to overlap the gate line GL and the first region AR_1 of each pixel PX. However, as the array substrate AS and the counter substrate OAS are bent, a misalignment in which the light shielding member BM is disposed to overlap the gate line GL, the second region AR_2, and the first region AR_1 occurs, which may reduce the transmittance.

For example, such a phenomenon may occur in region B and region D of FIG. 6, when viewed from the side surface of the display device of the curved shape. In detail, the liquid crystal layer LCL is injected between the array substrate AS and the counter substrate OAS, and the counter substrate OAS and the array substrate AS are bonded by a sealing member along the edges so that the liquid crystal molecules of the injected liquid crystal layer LCL do not leak. Since the distance from the sealing member (i.e., from the bonded edges of the substrates AS and OAS) to the regions B and D is larger than the distance from the sealing member to regions A and E, a misalignment with the light shielding member BM may occur in the regions B and D. Further, since region C is a central region of the display device and is symmetrically bent on both sides to a same extent, the misalignment of the light shielding member BM may occur in the region B and the region D, rather than the region C.

As an example, when the radius of curvature of the display panel 140 having a size of 48 inches is about 3000 mm, and the light shielding members BM is disposed in the regions B and D regions, a misalignment of about 26.7 μm to the left or the right from the second region AR_2 may occur. Similarly, when the radius of curvature of the display panel 140 having a size of 48 inches is about 4000 mm, a misalignment of the light shielding member of about 19.9 μm may occur, and when the radius of curvature of the display panel 140 having the size of 48 inches is about 5000 mm, a misalignment of about 15.8 μm may occur in the light shielding member BM. That is, as the radius of curvature is decreased, a misalignment of the light shielding member BM may increase.

When the radius of curvature of the display panel 140 having a size of 55 inches is about 3000 mm, a misalignment of the light shielding member of about 32 μm may occur, and when the radius of curvature of the display panel 140 having the size of 65 inches is about 3000 mm, a misalignment of about 38.9 μm may occur in the light shielding member BM. Further, when the radius of curvature of the display panel 140 having the size of 105 inches is about 3000 mm, a misalignment of about 72.2 μm may occur in the light shielding member BM. That is, as the size of the display panel 140 is increased, a misalignment of the light shielding member BM may increase.

Therefore, by changing the structure of the light shielding member BM, it is possible to minimize the misalignment of the light shielding member BM described above, and the transmittance can be improved. This will be described in more detail with reference to FIGS. 7 to 10.

Figure 7:
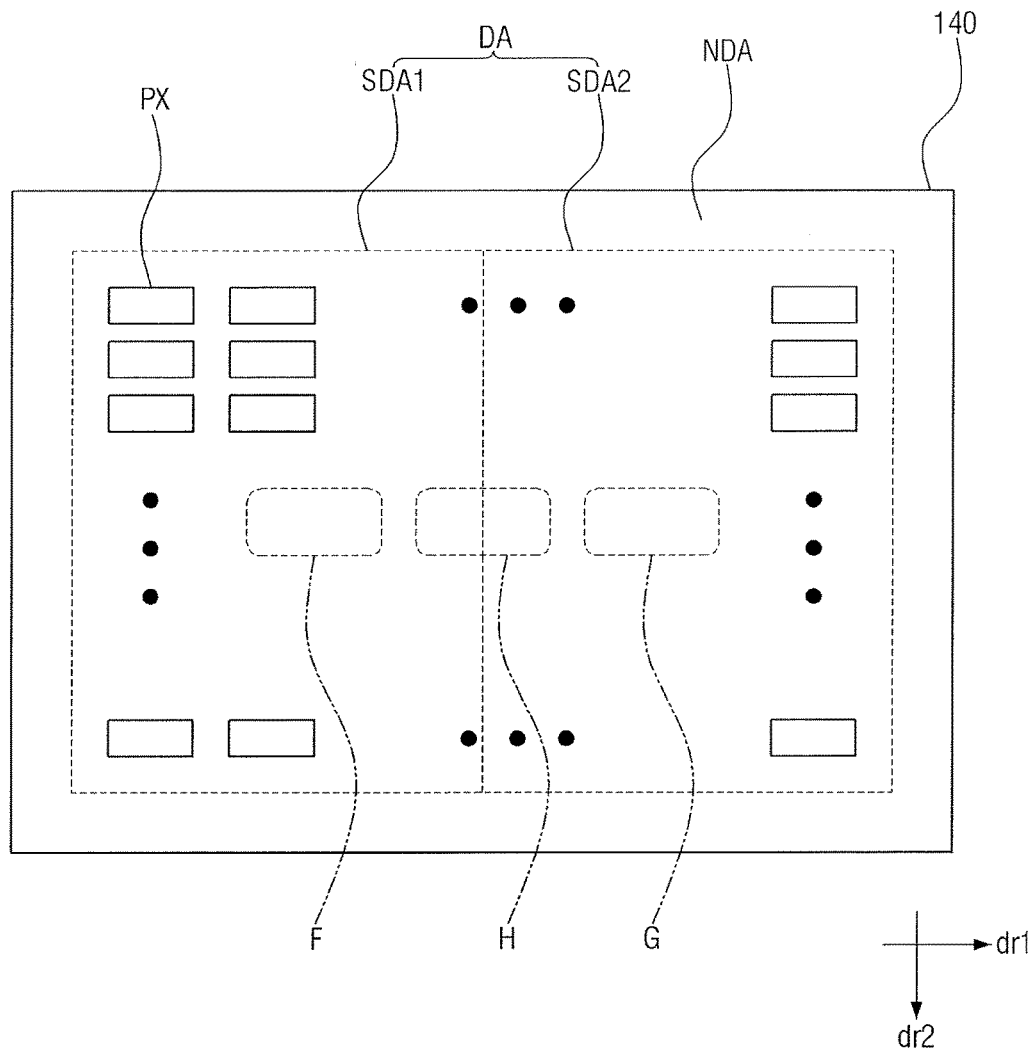
FIG. 7 illustrates a schematic diagram od a display panel of a display device according to another embodiment of the present disclosure.
Figure 8:
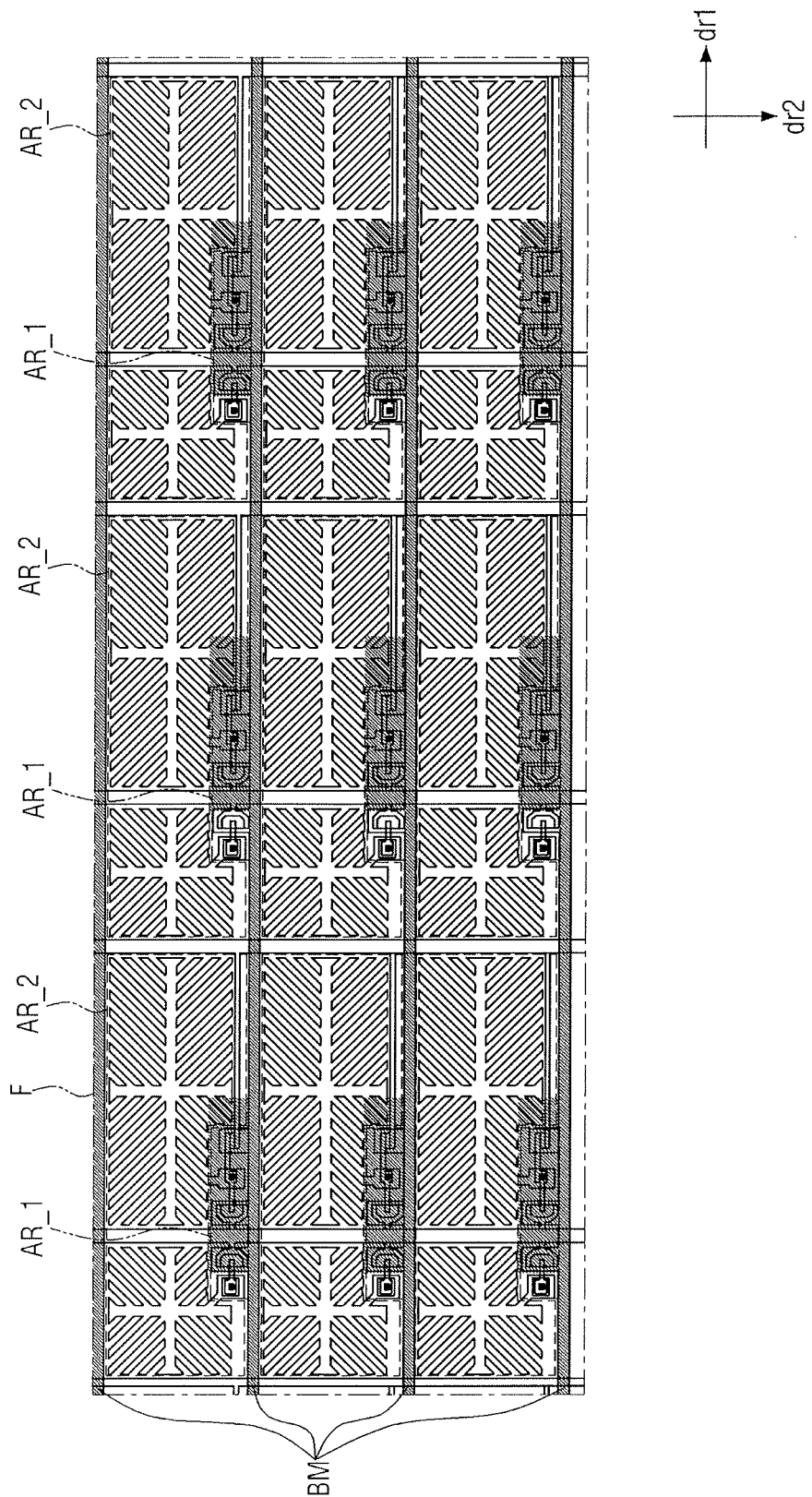
FIG. 8 illustrates an enlarged layout diagram of a region F of FIG. 7.
Figure 9:
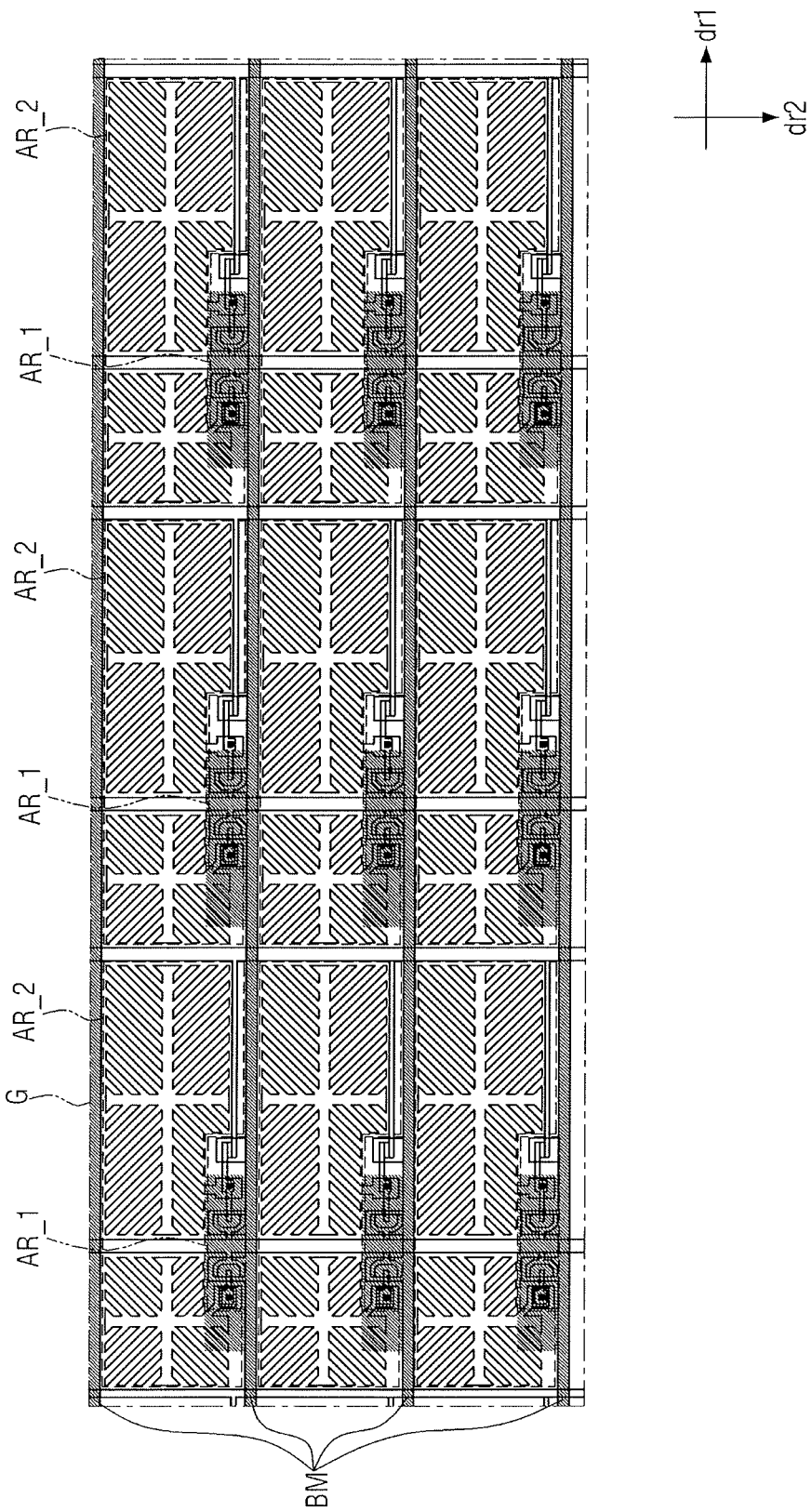
FIG. 9 illustrates an enlarged layout diagram of a region G of FIG. 7.
Figure 10:
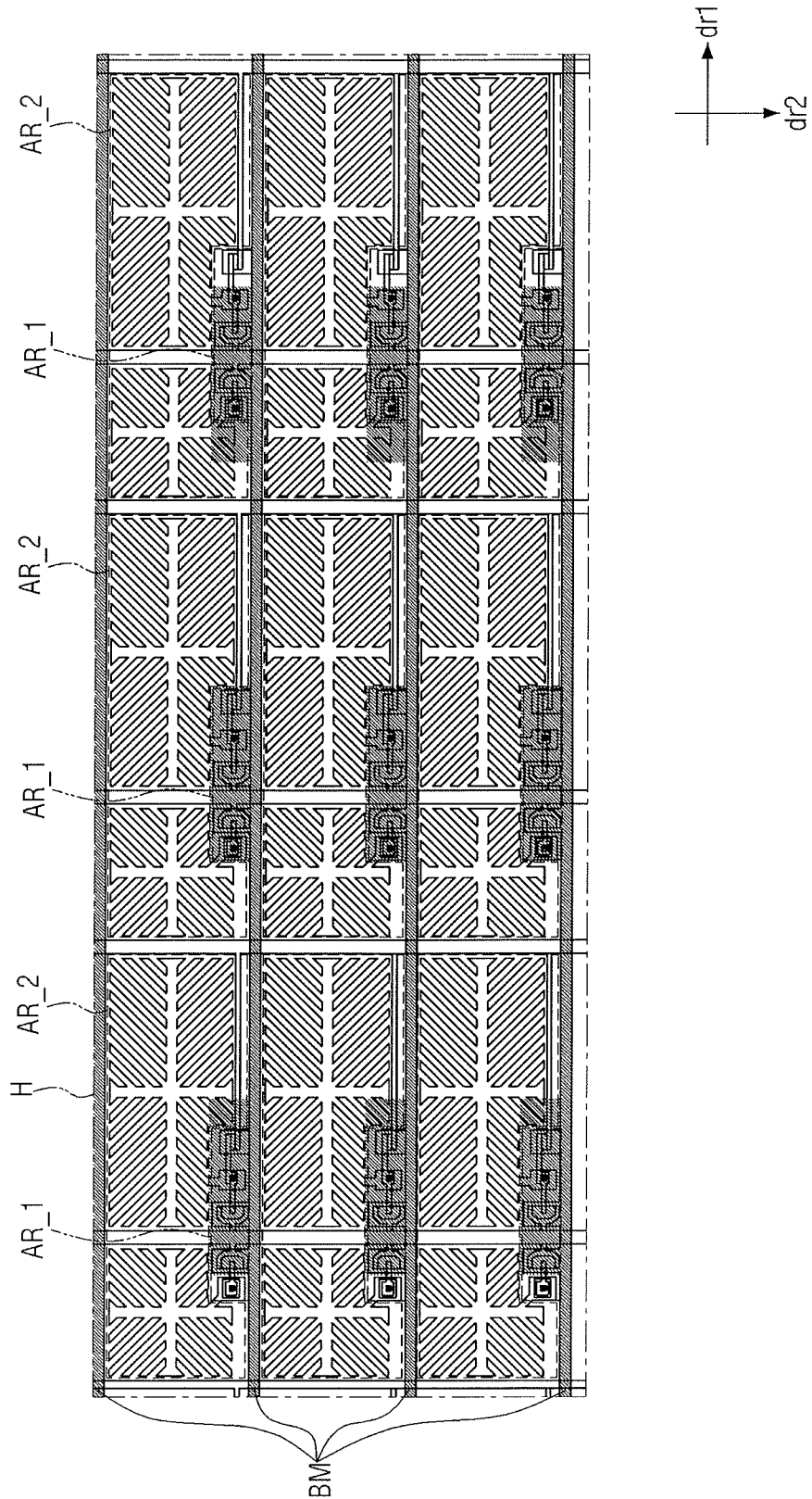
FIG. 10 illustrates an enlarged layout diagram of a region H of FIG. 7.

FIG. 7 is a schematic view illustrating a display panel of a liquid crystal display device according to another embodiment of the present disclosure, FIG. 8 is an enlarged layout diagram illustrating a region F of FIG. 7, FIG. 9 is an enlarged layout diagram illustrating a region G of FIG. 7, and FIG. 10 is an enlarged layout diagram illustrating a region H of FIG. 7.

Referring to FIG. 7, region F illustrates a region in which pixels PX disposed at a center of a first sub-display region SDA1 of the display panel 140, as well as pixels PX disposed in a vicinity thereof, are disposed. Region G illustrates a region in which pixels PX disposed at a center of a second sub-display region SDA2 of the display panel 140, as well as pixels PX disposed in the vicinity thereof, are disposed. Region H illustrates a region in which pixels PX disposed on a boundary between the first sub-display region SDA1 and the second sub-display region SDA2, as well as pixels disposed in the vicinity thereof, are disposed.

In the following embodiments, the same configurations as the above-described configuration will be denoted by the same reference numerals, and a repeated description will be omitted or simplified. The liquid crystal display device illustrated in FIGS. 7 to 10 corresponds to the liquid crystal display device of FIGS. 5 and 6 before being bent in a specific direction.

Referring to FIGS. 7 to 10, the display panel 140 may include the display region DA and the non-display region NDA. As described above, the pixels PX may be disposed in the display region DA, and components necessary for driving the pixels PX may be disposed in the non-display region NDA.

The display region DA includes the first sub-display region SDA1 and the second sub-display region SDA1. The first sub-display region SDA1 is a region corresponding to a left half side of the display region DA when bisecting the display region DA along a straight line extending along the second direction dr2, and the second sub-display region SDA2 is a region corresponding to a right half side of the display region DA when bisecting the display region DA along a straight line extending along the second direction dr2. That is, the display region DA includes the first sub-display region SDA1 disposed on the right side from the center, and a second sub-display region SDA2 disposed on the left side are from the center.

The pixels PX disposed in the first sub-display region SDA1 and the pixels PX provided in the second sub-display region SDA2 may be different from each other in the arrangement of the light shielding member BM. In detail, the light shielding member BM is disposed to partially overlap the gate line GL and a partial region of each pixel PX in the first sub-display region SDA1 and the second sub-display region SDA2. Here, since the gate line GL extends in the first direction dr1 to pass through the first sub-display region SDA1 and the second sub-display region SDA2, the region in which the light shielding member BM is disposed to extend in the first direction dr1 through the first sub-display region SDA1 and the second sub-display region SDA2 corresponds to a region that overlaps the gate line GL. Meanwhile, the region of the light shielding member BM disposed to protrude from the region of the light shielding member BM overlapping the above-described gate line GL to one side or the other side in the second direction dr2 corresponds to a region of the light-shielding member BM disposed to overlap a partial region of the pixel PX.

Here, the region of the light shielding member BM disposed to overlap a partial region of the pixel PX is formed in the same shape as the first region AR_1 of each pixel PX. The light shielding member BM is disposed in the first sub-display region SDA1 so as to be biased, e.g., deviate, to the right side from the first region AR_1, and is disposed in the second sub-display region SDA2 so as to be biased, e.g., deviate, to the left side from the first region AR_1. For example, as illustrated in FIGS. 8-9, the light shielding member BM may not completely overlap the first region AR_1, but may be slightly offset to expose a small portion thereof.

Therefore, even if the display panel 140 is bent as in the embodiment illustrated in FIGS. 5 and 6, by the arrangement of the above-mentioned light shielding member BM, it is possible to minimize a reduction in transmittance due to the misalignment of the light shielding member BM. In detail, as in the embodiment illustrated in FIGS. 5 and 6, when the display panel 140 according to the present embodiment is bent along the first direction dr1 to have a constant curvature around an arbitrary straight line extending in the second direction dr2 as an axis, the light shielding member BM disposed in the first sub-display region SDA1 may be disposed to be biased, e.g., shifted, to the relatively left side as compared to the display panel 140 before being bent, and the light shielding member BM disposed in the second sub-display region SDA2 may be disposed to be biased, e.g., shifted, in the relatively right side as compared to the display panel 140 before being bent.

When the light shielding member BM disposed in the first sub-display region SDA1 is disposed to be biased to the right side from the first region AR_1, and the light shielding member BM disposed in the second sub-display region SDA2 is disposed to be biased to the left side from the first region AR_1, the light shielding member BM which is moved with the bending of the display panel 140 may accurately overlap the first region AR_1, thereby improving the transmittance, e.g., minimizing overlap of the pixel electrode. However, as illustrated in FIG. 10, in the case of the pixels PX disposed on the boundary between the first sub-region SDA1 and the second sub-region SDA2 in which the misalignment of the light shielding member BM does not occur, the light shielding member BM and the second region AR_2 may overlap each other so as not to shift. Meanwhile, as described in the description of FIG. 6, the misalignment of the light shielding member BM may most significantly occur in the pixel disposed at the center of the first sub-display region SDA1 and the second sub-display region SDA2, and the misalignment of the light shielding member BM may insignificantly occur in the light shielding member BM disposed away from the pixels.

Therefore, the extent to which the light shielding member BM is biased to the right side from the first region AR_1 may be greatest in the pixels disposed at the center of the first sub-display region SDA1. Further, the extent to which the light shielding member BM is biased to the right side from the first region AR_1 may be disposed to be relatively smaller in the pixels disposed on the left or right from the center of the first sub-display region SDA1, that is, the pixels disposed farther, and this case, the effect of improving the transmittance may be maximized.

Similarly, the extent to which the light shielding member BM is biased to the left side from the first region AR_1 may be greatest in the pixels disposed at the center of the second sub-display region SDA2. Further, the extent to which the light shielding member BM is biased to the left side from the first region AR_1 may be relatively smaller in the pixels disposed on the left or right from the center of the first-sub display region SDA2, that is, the pixels disposed farther, and in this case, the effect of improving the transmittance may be maximized.

Figure 11:
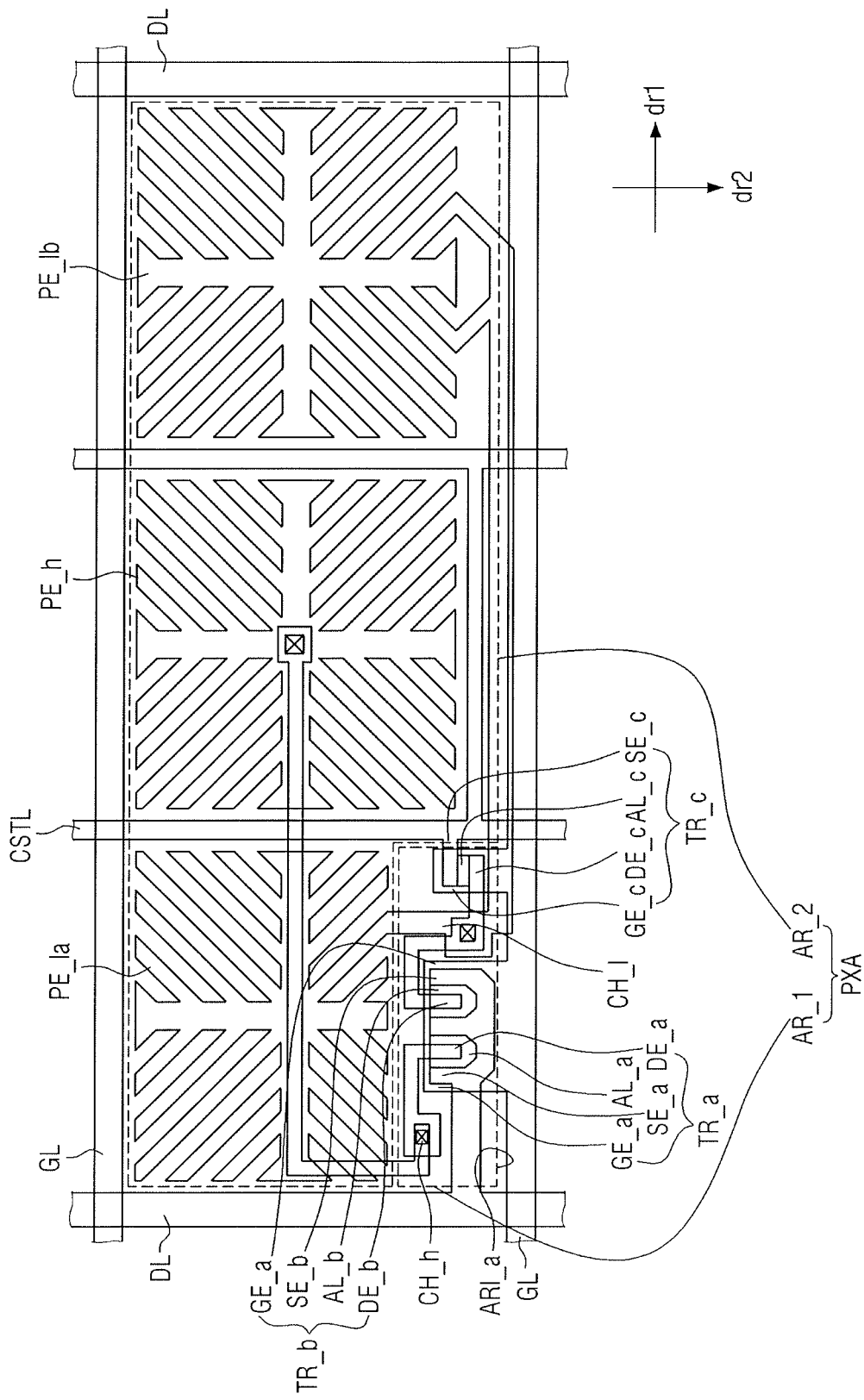
FIG. 11 illustrates a layout diagram of a single pixel of a display panel according to another embodiment of the present disclosure.

FIG. 11 is a layout diagram of a single pixel of a display panel according to another embodiment of the present disclosure. In the following examples, the same configuration as the above-described configuration will be denoted by the same reference numbers, and the repeated description will be omitted or simplified.

A single pixel according to the embodiment illustrated in FIG. 11 is different in an arrangement structure of the second sub-pixel electrodes PE_l from the single pixel according to the embodiment illustrated in FIG. 2. According to the embodiment illustrated in FIG. 11, unlike the second sub-pixel electrode PE_l illustrated in FIG. 2, the pixel may include two second sub-pixel electrodes PE_la and PE_lb. Although the second sub-pixel electrode PE_la and the second sub-pixel electrode PE_lb may perform the same role as the single second sub-pixel electrode PE_l described previously, the two second sub-pixel electrodes PE_la and PE_lb may be disposed to be physically spaced apart from each other.

In detail, the second sub-pixel electrode PE_la and the second sub-pixel electrode PE_lb may be disposed to be spaced apart from each other with first sub-pixel electrode PE_h interposed therebetween. The same voltage is applied to the second sub-pixel electrode PE_la and the second sub-pixel electrode PE_lb, and a voltage different from the voltage applied to the second sub-pixel electrode PE_la and the second sub-pixel electrode PE_lb may be applied to the first sub-pixel electrode PE_h. By disposing the first sub-pixel electrode PE_h smaller than the total area of the second sub-pixel electrodes PE_la and the second sub-pixel electrode PE_lb between the second sub-pixel electrode PE_la and the second sub-pixel electrode PE_lb, a uniform display quality can be obtained. Both of the second sub-pixel electrodes PE_la and PE_lb may be connected to the second drain electrode DE_b and the third drain electrode DE_c, which is the same as described in the description of the embodiment of FIG. 2.

Other explanations except for the arrangement within the first region AR_1, the second region AR_2, and the pixel region PXA of the embodiment illustrated in FIG. 2 may be directly applicable to the first region AR_1 and the second region AR_2 illustrated in this example. However, the arrangements of the first region AR_1 and the second region AR_2 within the pixel region PXA may be partially different, e.g., the first region AR_1 may be disposed adjacent to the adjacent data line DL. However, the embodiment is not limited thereto, and the arrangement of the first region AR_1 and the second region AR_2 may be freely determined in consideration of the area of the first sub-pixel electrode PE_h and an area ratio of the second sub-pixel electrodes PE_la and PE_lb. For example, the first region AR_1 may be disposed below the first sub-pixel electrode PE_h, and may be disposed so that areas occupied by each of the second sub-pixel electrode PE_la and PE_lb are the same.

Figure 12:
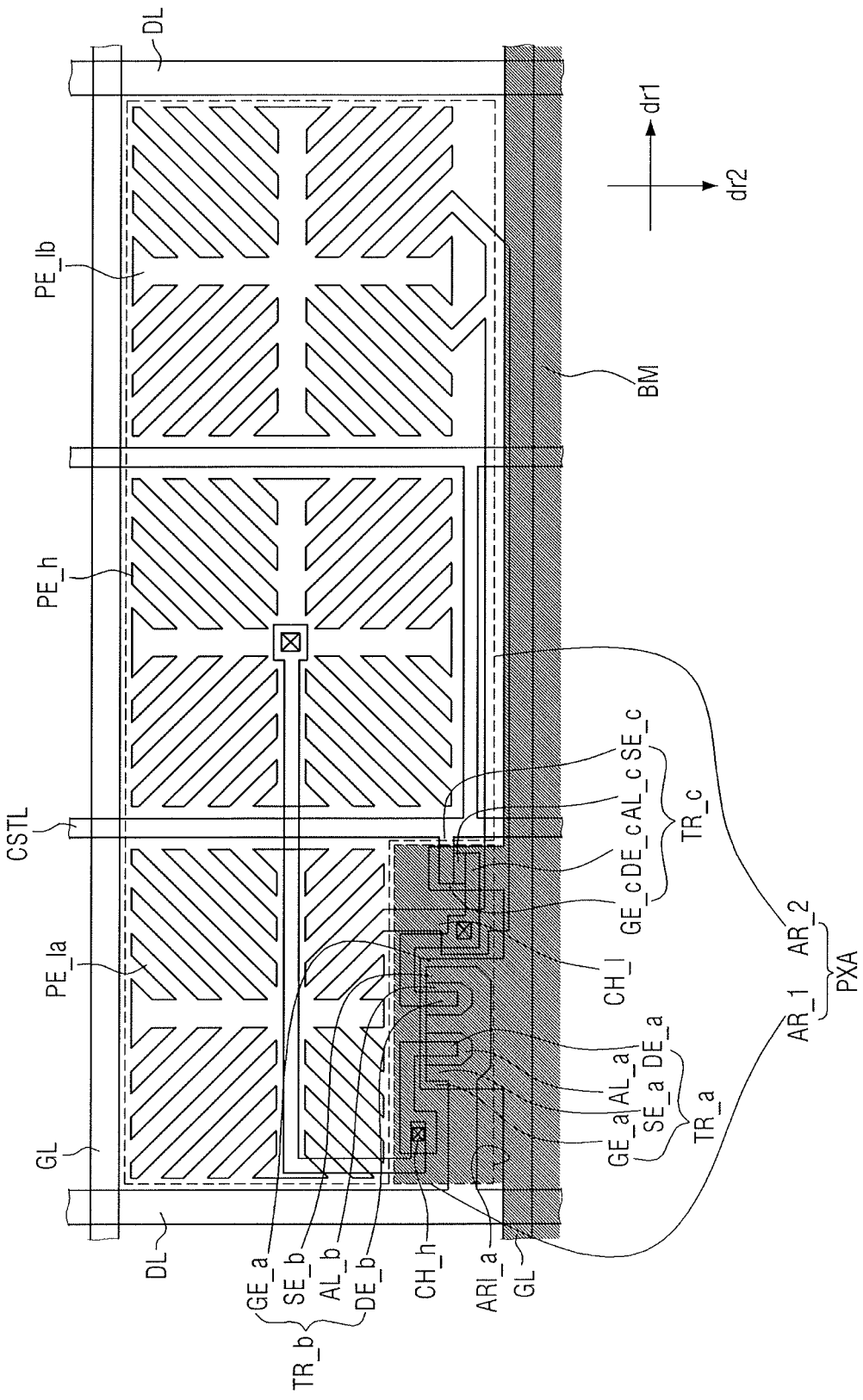
FIGS. 12 to 14 illustrate layout diagrams of a single pixel of the display panel in FIG. 11 with an additionally illustrated light shielding member.
Figure 13:
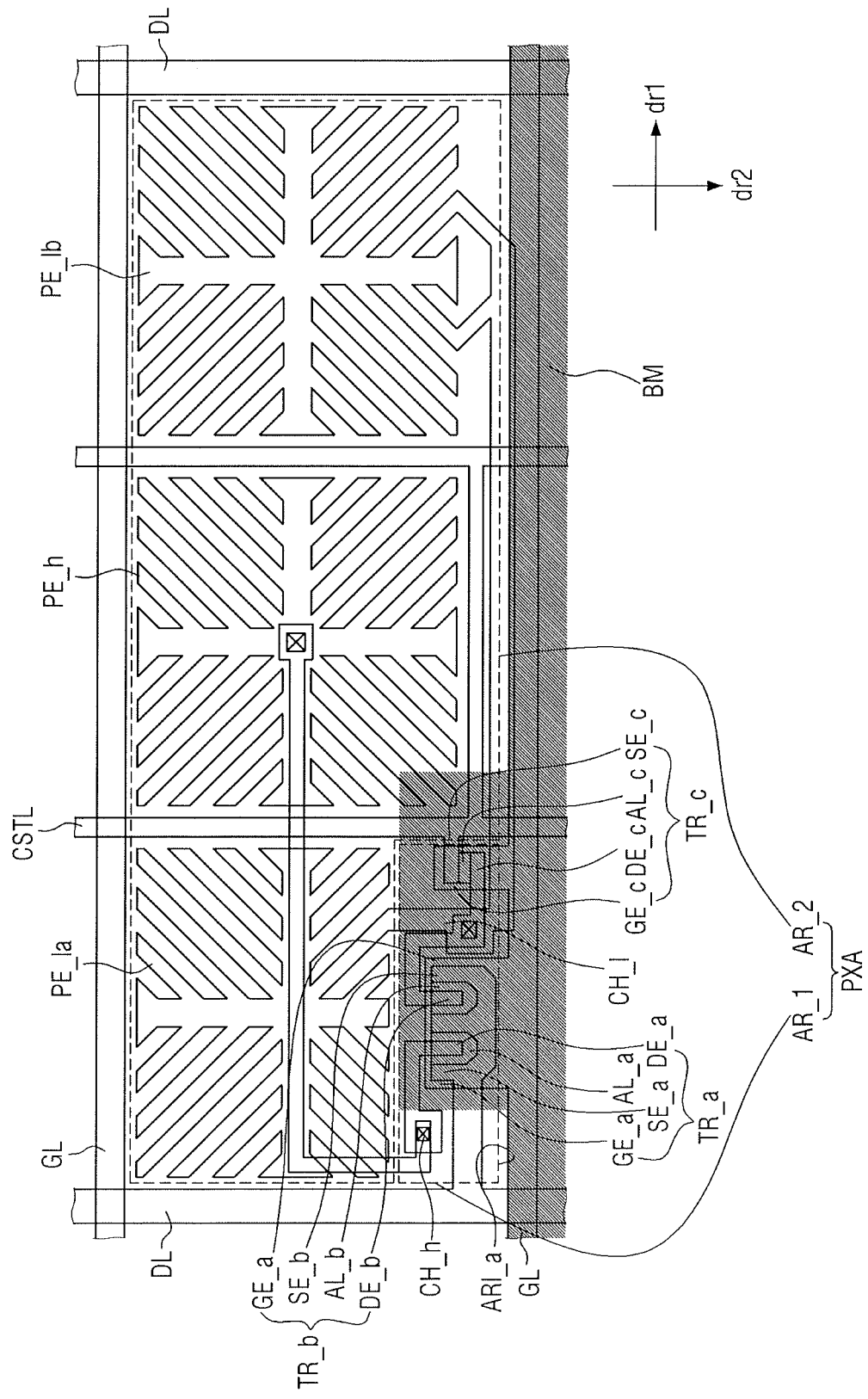
Figure 14:
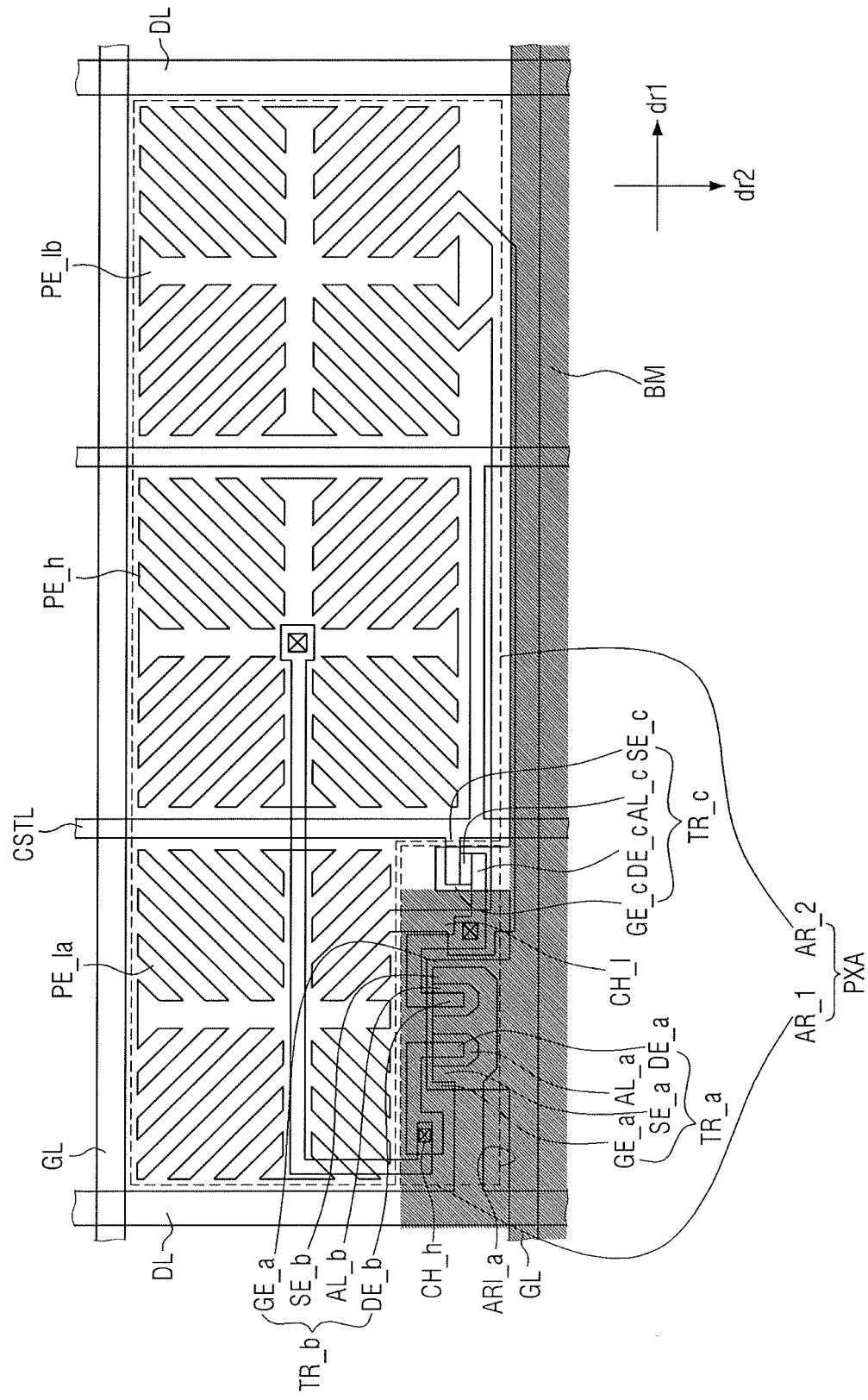

FIGS. 12 to 14 are layout diagrams in which the light shielding member BM is additionally illustrated in the different single pixels of the display panel 140 in FIG. 11. In the following embodiment, the same configuration as the above-described configuration will be denoted by the same reference numerals, and the repeated description will be omitted or simplified.

Referring to FIG. 12, the light shielding member BM may be disposed to overlap the first region AR_1 and the gate line GL. The light shielding member BM may be disposed below the second base substrate SUB2, and may block the light leakage due to the misalignment of the liquid crystal molecules, as described above. Meanwhile, although FIG. 12 illustrates a structure in which the light shielding member BM accurately overlaps the first region AR_1, the light-shielding member BM may also be disposed to shift from the first region AR_1, without being limited thereto.

In the case of the pixels illustrated in FIG. 13, the light shielding member BM is disposed to overlap the gate line GL, and may be disposed to be biased to the right from the first region AR_1. The arrangement structure of the light shielding member BM may be an arrangement structure of the light shielding member BM of the pixels PX disposed in a region corresponding to the first sub-display region SDA_1 of FIG. 7.

Similarly, in the case of the pixels PX illustrated in FIG. 14, the light shielding member BM is disposed to overlap the gate line GL, and may be disposed to be biased to the left from the first region AR_1. The arrangement structure of the light shielding member BM may be an arrangement structure of the light shielding member BM of the pixels PX disposed in a region corresponding to the second sub-display region SDA_2 of FIG. 7.

As described above, with the arrangement structure of the light shielding member BM, the misalignment of the light shielding member BM that may occur when the display panel 140 is bent to have a curvature is compensated in advance, and thus, it is possible to minimize a reduction in the transmittance due to the misalignment of the light shielding member BM that may occur when the display panel 140 is bent.

Figure 15:
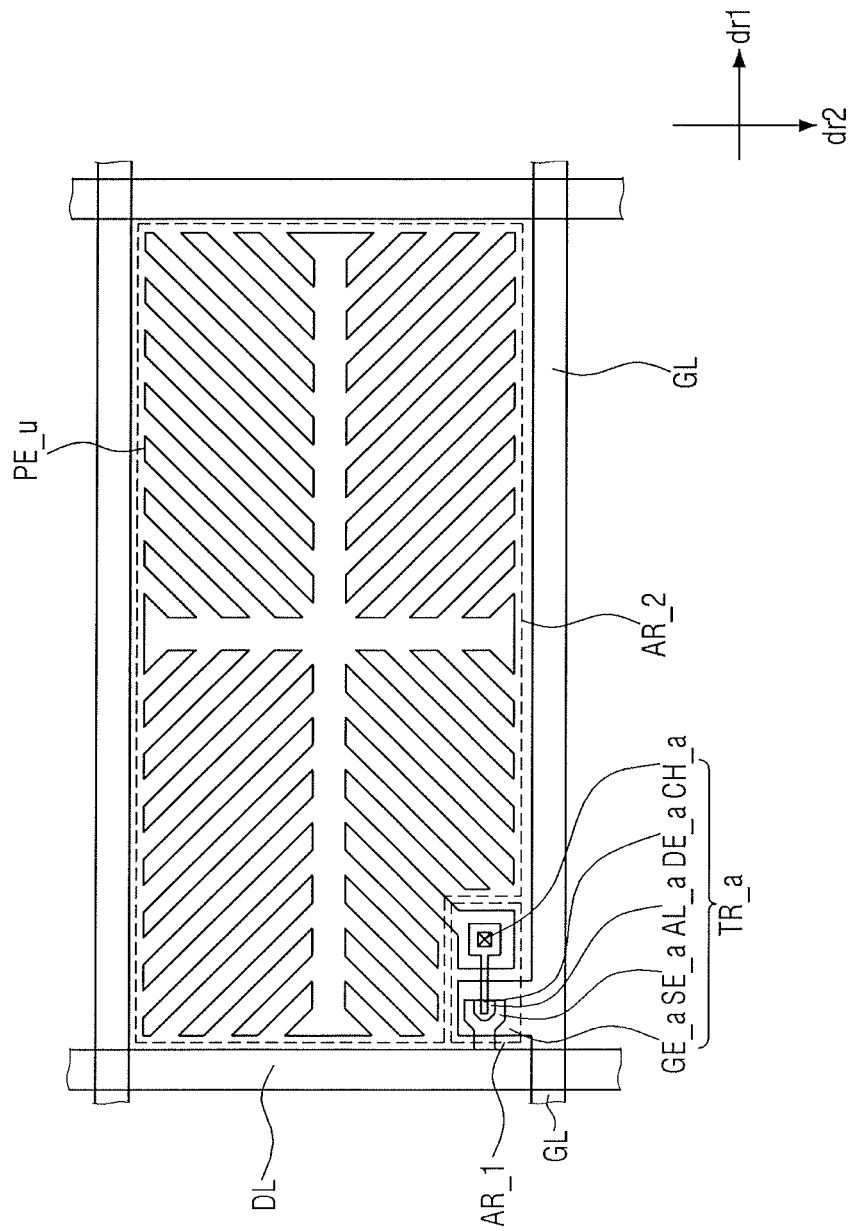
FIG. 15 illustrates a layout diagram of a single pixel of a display panel according to another embodiment of the present disclosure.

FIG. 15 is a layout diagram of a single pixel of the display panel according to another embodiment of the present disclosure. In the following embodiment, the same configuration as the above-described configuration will be denoted by the same reference numerals, and the repeated description will be omitted or simplified.

The single pixel according to the embodiment illustrated in FIG. 15 is different in the structure of the first sub-pixel electrode PE_h and the second sub-pixel electrode PE_l from the single pixel according to the embodiment illustrated in FIG. 2. According to the embodiment illustrated in FIG. 15, instead of including the first sub-pixel electrode PE_h and the second sub-pixel pixel electrode PE_l illustrated in FIG. 2, the pixel may include only a single pixel electrode PE_u. Unlike the embodiment illustrated in FIG. 2 that divides the second region AR_2 into two regions to form an electric field having the different intensities in the liquid crystal layer LCL, the single pixel electrode PE_u of the present embodiment may form an electric field having the same intensity throughout the liquid crystal layer LCL disposed in the second region AR_2.

Further, since only the single pixel electrode PE_u receiving the single same voltage through the second region AR_2 is disposed, it is possible to drive the liquid crystal device, only using one switching element. That is, it is possible to drive the liquid crystal device, only using the first transistor TR_a of the embodiment illustrated in FIG. 2, and the second transistor TR_b and the third transistor TR_c may be omitted. Further, as the second transistor TR_b and the third transistor TR_c are omitted, the second contact hole CH_l and the storage line CSTL may be omitted.

Meanwhile, the first transistor TR_a and the first contact hole CH_h may be disposed in the first region AR_1, and a single pixel electrode PE_u may be disposed in the second region AR_2. In the case of the pixel including a single pixel electrode PE_u as in this embodiment, since a ratio occupied by the first region AR_1 in the pixel region PXA is reduced, the transmittance of the liquid crystal display device may be improved.

The same contents as described in the description of the embodiment illustrated in FIG. 2 may be applied to all components other than this, which will be omitted.

Figure 16:
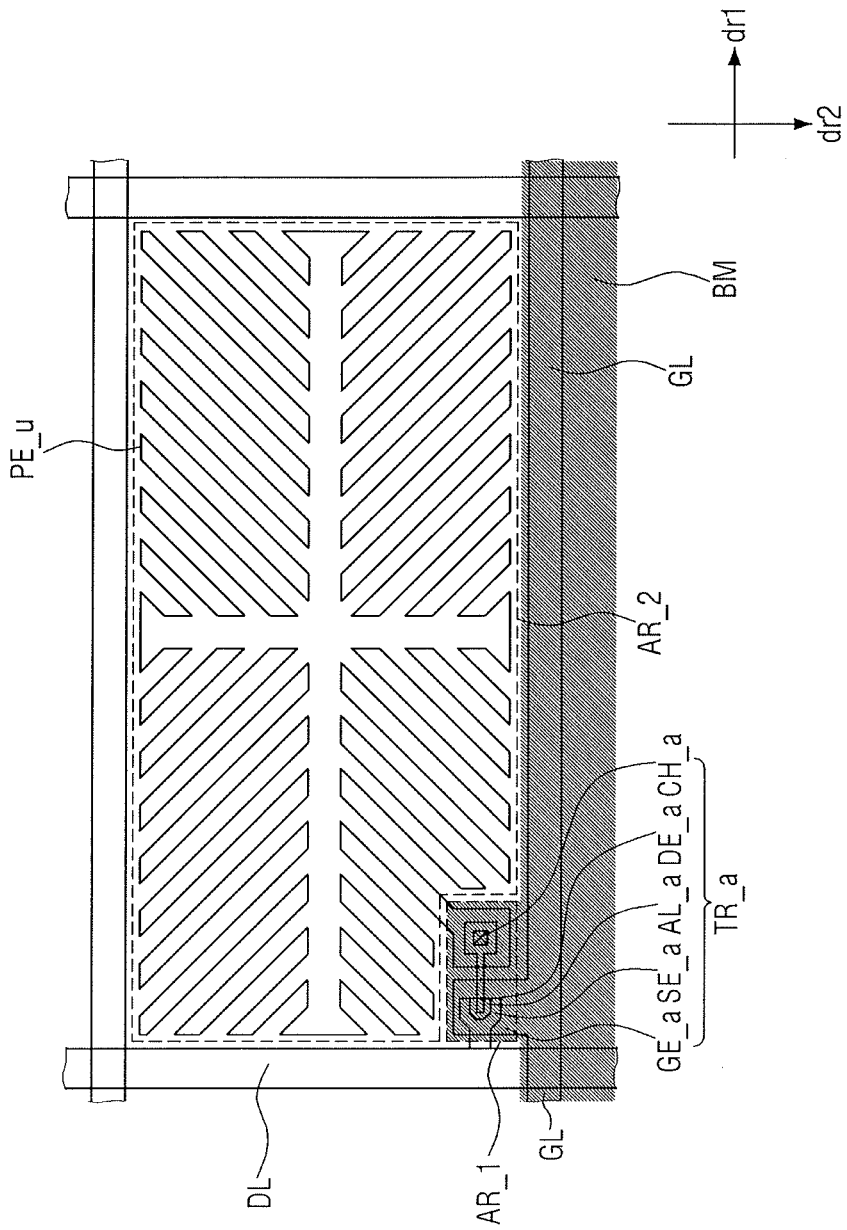
FIGS. 16 and 18 illustrate layout diagrams of a single pixel of the display panel in FIG. 15 with an additionally illustrated light shielding member.
Figure 17:
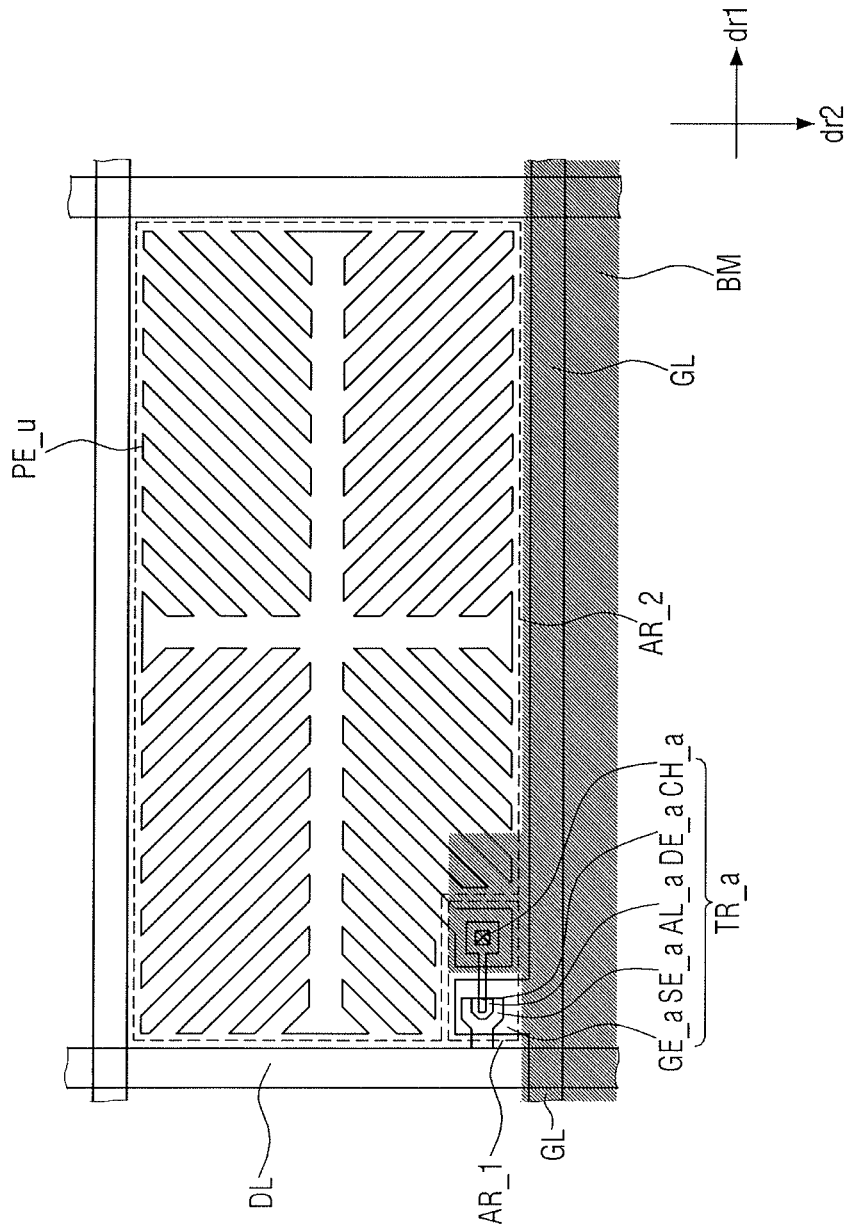
Figure 18:
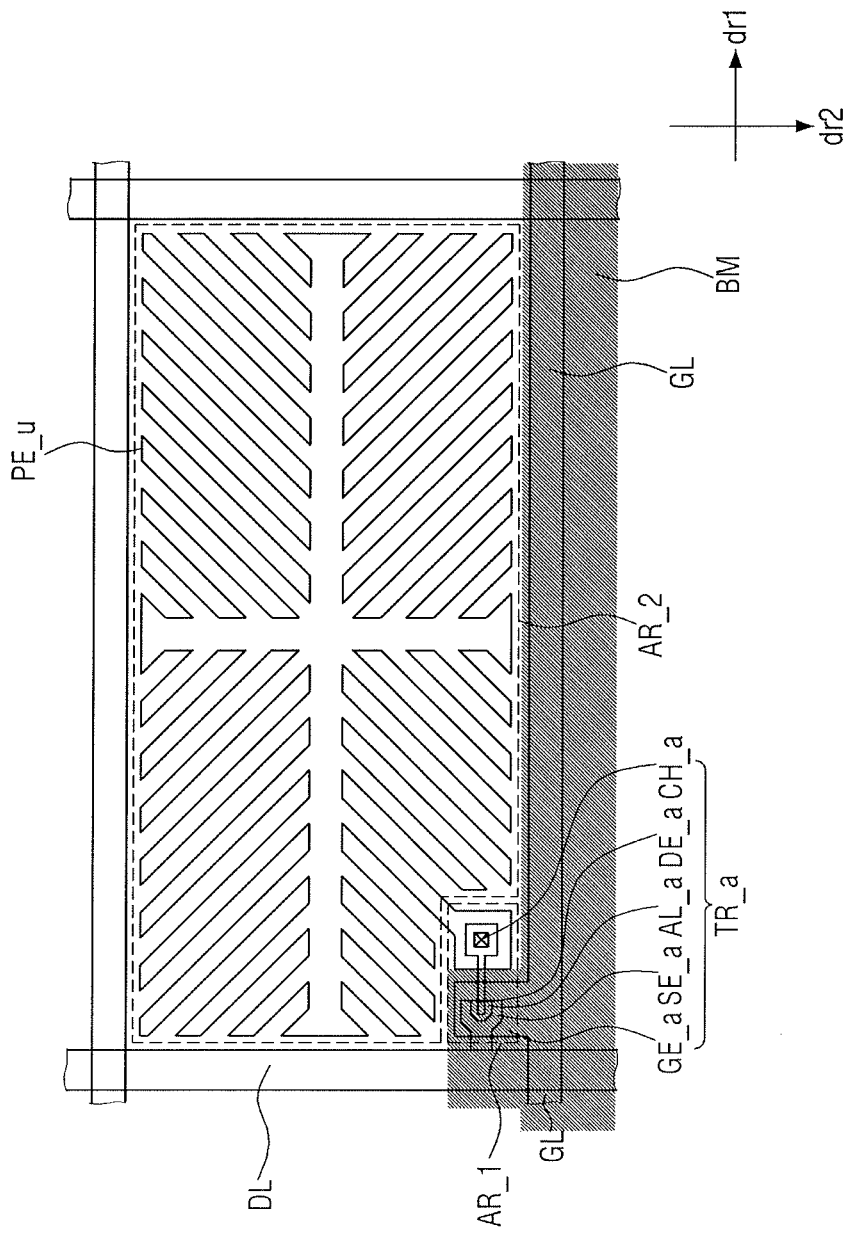

FIGS. 16 to 18 are layout diagrams in which the light shielding member is additionally disposed in the different single pixels of each of the display panel according to the embodiment illustrated in FIG. 15. In the following examples, the same configurations as the above-described configuration will be denoted by the same reference numerals, and the repeated description will be omitted or simplified.

Referring to FIG. 16, the light shielding member BM may be disposed to overlap the first region AR_1 and the gate line GL. The light shielding member BM may be disposed below the second base substrate SUB2, and may block the light leakage due to the misalignment of the liquid crystal molecules, as described above.

Meanwhile, although FIG. 16 illustrates a structure in which the light shielding member BM correctly overlap the first region AR_1, the light-shielding member BM may be disposed to shift from the first region AR_1, without being limited thereto.

In the pixels PX illustrated in FIG. 17, the light shielding member BM is disposed to overlap the gate line GL, and may be disposed to be biased to the right from the first region AR_1. The arrangement structure of the light shielding member BM may be an arrangement structure of the light shielding member BM of the pixels PX disposed in a region corresponding to the first sub-display region SDA1 of FIG. 7.

Similarly, in the case of the pixels PX illustrated in FIG. 18, the light shielding member BM is disposed to overlap the gate line GL, and may be disposed to be biased to the left from the first region AR_1. The arrangement structure of the light shielding member BM may be an arrangement structure of the light shielding member BM of the pixels PX disposed in a region corresponding to the second sub-display region SDA2 of FIG. 7.

By way of summation and review, a flat panel display device may have a curved surface to provide an image with improved three-dimensional feeling and immersion feeling by providing a display region of the curved surface. The display device may be formed with a light shielding member that covers regions other that those displaying images.

However, when forming the light shielding member, some errors may occur in its arrangement. For example, in a case of a curved surface a display device, light transmittance may be reduced due to an arrangement error or the like, e.g., misalignment, of the light shielding member that occurs during manufacturing the curved surface.

In contrast, according to embodiments of the present disclosure, it is possible to provide a display device capable of minimizing a decrease in transmittance. Further, it is possible to provide a display device capable of improving light transmittance. That is, according to embodiments of the present disclosure, the light shielding member may be arranged so misalignment thereof, e.g., that may potentially occur when the display panel is bent to have a curvature, is compensated in advance. Thus, it is possible to prevent or substantially minimize an overlap between the light shielding member and regions of the display panel that display images, e.g., emit light. As such, reduction in light transmittance due to the misalignment of the light shielding member may be prevented or substantially minimized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A liquid crystal display device, comprising:
   a first gate line and a second gate line extending in a first direction;
   a data line extending in a second direction intersecting the first direction and configured to receive a data signal;
   a first storage line and a second storage line extending in the second direction and configured to receive a storage signal which is different from the data signal;
   a pixel disposed in a pixel area surrounded by the first gate line, the second gate line, the first storage line, and the second storage line; and
   a light shielding layer overlapping the first gate line, wherein
   the pixel area includes:
   a first region where a first transistor and a first contact hole are disposed, the first transistor being connected to the data line and the first gate line, and
   a second region where a first pixel electrode is disposed, wherein the first pixel electrode is connected to the first transistor via the first contact hole,
   wherein a maximum width of the first pixel electrode in the second direction is narrower than a maximum width of the first pixel electrode in the first direction,
   wherein a maximum width of the first region in the first direction is wider than a maximum width the first region in the second direction,
   wherein a maximum width of the second region in the first direction is wider than a width the second region in the second direction, and
   wherein the light shielding layer includes a portion overlapping the first transistor and the first contact hole, and
   wherein a width of the portion of the light shielding layer in the second direction is narrower than a width of the portion of the light shielding layer in the first direction.

2. The liquid crystal display device as claimed in claim 1, wherein the pixel includes a plurality of pixels, the light shielding layer is not in a region between pixel electrodes of two pixels of the plurality of pixels adjacent to each other in the first direction.

3. The liquid crystal display device as claimed in claim 1, further comprising
   a second transistor disposed in the first region; and
   a second sub-pixel electrode disposed in the second region, the second sub-pixel electrode connected to the second transistor via a second contact hole,
   wherein the second contact hole is disposed in the first region, and
   wherein the data line is disposed between the first sub-pixel electrode and the second sub-pixel electrode.

4. The liquid crystal display device as claimed in claim 3, wherein the second transistor is connected to the first gate line and the data line.

5. The liquid crystal display device as claimed in claim 3, wherein the first transistor and the second transistor are adjacent to each other in the first direction, and wherein the data line is disposed between the first transistor and the second transistor.

6. The liquid crystal display device as claimed in claim 3, wherein the first and second transistors are adjacent to the first gate line.

7. The liquid crystal display device as claimed in claim 1, wherein the pixel includes a plurality of pixels, respective pixels of the plurality of pixels adjacent to one another in the second direction transmit light of different wavelength bandwidths.

8. The liquid crystal display device as claimed in claim 7, wherein respective pixels of the plurality of pixels adjacent to one another in the first direction transmit light of a same wavelength bandwidth.

9. A liquid crystal display device, comprising:
   a display region including a plurality of pixels arranged in a matrix pattern, the plurality of pixels being adjacent to each other along a first direction extending right to left on a plane and along a second direction intersecting the first direction on the plane;
   a plurality of gate lines extending in the first direction on the display region;
   a plurality of data lines extending in the second direction on the display region; and
   a light shielding layer on the display region, the light shielding layer overlapping a partial region of each pixel and the plurality of gate lines, wherein
   the display region includes a first sub-display region on a left side from a center of the display region, and a second sub-display region on a right side from the center of the display region, wherein
   each of the plurality of pixels includes a first region and a second region, the first region including a transistor, which is connected to a respective gate line of the plurality of gate lines and to a respective data line of the plurality of data lines, and a contact hole connecting the transistor to a pixel electrode, the second region including the pixel electrode including a first sub-pixel electrode and a second sub-pixel electrode, the first sub-pixel electrode and the second sub-pixel electrode to receive different voltages and being divided by the data line passing between the first sub-pixel electrode and the second sub-pixel electrode,
   wherein the partial region of each of the plurality of pixels corresponds to the first region of each of the plurality of pixels,
   wherein first portions of the light shielding layer overlaps the first regions of the plurality of pixels in the first sub-display region, the first portions of the light shielding layer being biased toward a right side of the first regions of the plurality of pixels in the first sub-display region such that the first portions of the light shielding layer do not cover a left side of the first regions of the plurality of pixels in the first sub-display region, and cover the right side of the first regions of the plurality of pixels in the first sub-display region, and
   wherein second portions of the light shielding layer overlaps the first regions of the plurality of pixels in the second sub-display region, the second portions of the light shielding layer being biased toward a left side of the first regions of the plurality of pixels in the second sub-display region such that the second portions of the light shielding layer do not cover a right side of the first regions of the plurality of pixels in the second sub-display region, and cover the left side of the first regions of the plurality of pixels in the second sub-display region.

10. The liquid crystal display device as claimed in claim 9, wherein the light shielding layer overlaps a boundary between the first sub-display region and the second sub-display region.

11. The liquid crystal display device as claimed in claim 9, wherein an extent to which the first portions of the light shielding layer in center pixels of the first sub-display region are biased toward the right side of the first regions of the plurality of pixels in the first sub-display region is greater than an extent to which the first portions of the light shielding layer in left or right pixels adjacent to the center pixels of the first sub-display region are biased toward the right side of the first regions of the plurality of pixels in the first sub-display region.

12. The liquid crystal display device as claimed in claim 9, wherein an extent to which the second portions of the light shielding layer in center pixels of the second sub-display region are biased toward the left side of the first regions of the center pixels in the second sub-display region are greater than an extent to which the second portions of the light shielding layer in left or right pixels adjacent to the center pixels of the second sub-display region are biased toward the left side of the first regions of the left or right pixels in the second sub-display region.

13. The liquid crystal display device as claimed in claim 9, wherein a distance of a first width as a maximum value of a distance between two points on an arbitrary straight line extending along the first direction on the first region of each of the plurality of pixels is longer than a distance of a second width as a maximum value of the distance between two points on an arbitrary straight line extending along the second direction on the first region of each of the plurality of pixels, and a distance of a third width as a maximum value of a distance between two points on an arbitrary straight line extending along the first direction on the second region of each of the plurality of pixels is longer than a distance of a fourth width as a maximum value of the distance between two points on an arbitrary straight line extending along the second direction on the second region of each of the plurality of pixels.

14. The liquid crystal display device as claimed in claim 13, wherein:

the transistor includes a first transistor connected to the first sub-pixel electrode, and a second transistor connected to the second sub-pixel electrode, the contact hole includes a first contact hole that connects the first sub-pixel electrode and the first transistor, and a second contact hole that connects the second sub-pixel electrode and the second transistor, the first and second transistors and the first and second contact holes are disposed in the first region, and the first and second sub-pixel electrodes are in the second region.

15. The liquid crystal display device as claimed in claim 14, wherein the first transistor and the second transistor are in the first region to be adjacent to each other in the first direction.

16. The liquid crystal display device as claimed in claim 14, wherein the first and second transistors are adjacent to the gate line.

17. The liquid crystal display device as claimed in claim 9, wherein respective pixels adjacent to one another in the second direction transmit light of different wavelength bandwidths.

18. The liquid crystal display device as claimed in claim 17, wherein respective pixels adjacent to one another in the first direction transmit light of a same wavelength bandwidth.

19. The liquid crystal display device as claimed in claim 9, wherein the light shielding layer is not disposed in a region between pixel electrodes of two pixels adjacent to each other in the first direction.

\* \* \* \* \*